(12) United States Patent
Kirihara et al.

(10) Patent No.: US 9,343,647 B2
(45) Date of Patent: May 17, 2016

(54) POSITION DETECTION DEVICE

(75) Inventors: Akihiro Kirihara, Tokyo (JP); Hiroyuki Endoh, Tokyo (JP); Yasunobu Nakamura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 51 days.

(21) Appl. No.: 14/114,508

(22) PCT Filed: Apr. 19, 2012

(86) PCT No.: PCT/JP2012/061153
§ 371 (c)(1),
(2), (4) Date: Oct. 28, 2013

(87) PCT Pub. No.: WO2012/153642
PCT Pub. Date: Nov. 15, 2012

(65) Prior Publication Data
US 2014/0048115 A1 Feb. 20, 2014

(30) Foreign Application Priority Data
May 9, 2011 (JP) ................. 2011-104544

(51) Int. Cl.
*H01L 27/16* (2006.01)
*H01L 35/32* (2006.01)
(Continued)

(52) U.S. Cl.
CPC .............. *H01L 35/32* (2013.01); *G06F 3/041* (2013.01); *G06F 3/046* (2013.01); *H01L 27/16* (2013.01)

(58) Field of Classification Search
CPC ..................................... G06F 3/047
See application file for complete search history.

(56) References Cited

U.S. PATENT DOCUMENTS

| 5,515,738 A * | 5/1996 | Tamori ...................... G01L 1/16 310/338 |
| 5,565,658 A * | 10/1996 | Gerpheide et al. ......... 178/18.02 |
| 6,222,111 B1 * | 4/2001 | Kern ......................... G01J 5/12 136/201 |

(Continued)

FOREIGN PATENT DOCUMENTS

| EP | 1293769 A2 * | 3/2003 | ............. G01N 25/32 |
| GB | 2443316 A * | 4/2008 | |

(Continued)

OTHER PUBLICATIONS

Uchida, et al., "Observation of the spin Seebeck effect," Nature, vol. 455, pp. 778-781.*

(Continued)

*Primary Examiner* — James Lin
*Assistant Examiner* — William E McClain
(74) *Attorney, Agent, or Firm* — McGinn IP Law Group, PLLC

(57) ABSTRACT

A position detection device includes a thermoelectric conversion portion which includes a magnetic layer and a plurality of electrodes. The magnetic layer has magnetization. The plurality of electrodes are formed of a material having spin-orbit interaction, and are formed on the magnetic layer so as to extend in a direction which intersects with the magnetization direction of the magnetic layer. When an arbitrary location on the layer-surface of the magnetic layer is heated, the thermoelectric conversion portion modulates the effective temperature in the magnetic layer and induces a spin Seebeck effect. As a result, the thermoelectric conversion portion generates, from the plurality of electrodes, a voltage corresponding to the heated position as position information.

13 Claims, 18 Drawing Sheets

(51) Int. Cl.
*G06F 3/041* (2006.01)
*G06F 3/046* (2006.01)

(56) References Cited

U.S. PATENT DOCUMENTS

| | | | |
|---|---|---|---|
| 8,203,191 B2 | 6/2012 | Uchida et al. | |
| 2003/0057372 A1* | 3/2003 | Iida et al. | 250/338.4 |
| 2004/0208345 A1* | 10/2004 | Chou et al. | 382/124 |
| 2006/0070650 A1* | 4/2006 | Fraden | 136/224 |
| 2006/0267580 A1* | 11/2006 | Fukushima | G06F 3/03545 324/207.13 |
| 2010/0276770 A1 | 11/2010 | Uchida et al. | |
| 2011/0084349 A1* | 4/2011 | Uchida et al. | 257/421 |
| 2011/0155478 A1* | 6/2011 | Choi et al. | 178/18.03 |

FOREIGN PATENT DOCUMENTS

| | | |
|---|---|---|
| JP | 4-133123 A | 5/1992 |
| JP | 2008-10358 A | 1/2008 |
| JP | 2009-130070 A | 6/2009 |
| JP | 2009-295824 A | 12/2009 |
| JP | 2010-55453 A | 3/2010 |
| WO | WO 2009151000 A1 * 12/2009 | H01L 35/32 |

OTHER PUBLICATIONS

DiSalvo, "Thermoelectric Cooling and Power Generation," Science, vol. 285 (1999), pp. 703-706.*

Uchida, et al., "Local Spin-Seebeck Effect Enabling Two-Dimensional Position Sensing", Japanese Journal of Applied Physics, vol. 50, article 120211, pp. 1-3 (available Nov. 30, 2011).*

International Search Report in PCT/JP2012/061153 dated May 29, 2012 (English Translation Thereof).

Jiang Xiao et al., "Theory of magnon-driven spin Seebeck effect" Physical Review B 81, 214418 (2010).

Written Opinion of the ISA (English Translation of the relevant part thereof).

* cited by examiner

POSITION DETECTION DEVICE

TECHNICAL FIELD

This invention relates to a device for detecting a position where heat is generated.

BACKGROUND ART

A device or element capable of detecting two-dimensional position information is fully used for various devices including a user interface such as a touch panel and an image information acquiring device such as a sensor or a camera, and is considered to be more important as an interface between cyberspace and real space in Cloud Society in the future.

For example, many types of touch panels, such as a resistive film type, a capacitance type, and an infrared type, are proposed and actually demonstrated.

In the resistive film type, an upper conductive film and a lower conductive film are disposed closely to each other, and the panel stands by under a state where a bias voltage is applied to one of the conductive films. Here, when a touch pressure is applied from the outside, the upper conductive film and the lower conductive film are brought into contact with each other to be conductive at the touched point. Therefore, by measuring a potential at the point, the coordinates can be determined.

In the capacitance type, the panel stands by under a state where a drive voltage is appropriately applied to an electrode or a conductive film disposed on the panel. Here, when the panel is touched by a finger or the like, a variation of capacitance is caused. Therefore, by reading a voltage variation due to the capacitance variation at multiple points, the touched point can be detected.

In the infrared type, the panel stands by under a state where infrared light emitting elements (LEDs) are disposed in an array on one end of the panel, and infrared light receiving elements (photo transistors) are disposed in an array on the other end of the panel, so as to continuously scan with an infrared ray. Here, when a finger or the like approaches from the outside, the infrared ray is interrupted so that a photo transistor at a corresponding position is turned off. Thus, the touched point can be detected.

Patent Literature 1 and Patent Literature 2 disclose a heat/spin current conversion element and a spintronics device, which are basic devices utilizing the spin Seebeck effect that is also utilized in this invention as described later.

In addition, Patent Literature 3 discloses an example of a resistive film type touch panel. In addition, Non Patent Literature 1 discloses the theory of the spin Seebeck effect.

However, the touch panel type such as the resistive film type, the capacitance type, or the infrared type needs an external power supply for applying a bias voltage to detect a position or for probe drive means such as optical scan, and hence standby power is increased. Therefore, the usage is limited if the power supply is difficult. Even if a battery is used, maintenance and management burden such as exchange of the battery is inevitable. It is desired to provide position detection means that does not require a power supply or includes an effective power generation function for a future sensor network, a ubiquitous terminal or the like, which is expected to be used indoors and outdoors in various use scenes.

CITATION LIST

Patent Literature

Patent Literature 1: Japanese Unexamined Patent Application Publication (JP-A) No. 2009-130070
Patent Literature 2: Japanese Unexamined Patent Application Publication (JP-A) No. 2009-295824
Patent Literature 3: Japanese Unexamined Patent Application Publication (JP-A) No. 2010-055453

Non Patent Literature

Non Patent Literature 1: Physical Review B 81, 214418

DISCLOSURE OF THE INVENTION

Therefore, it is an object of this invention to provide a position detection device that does not need an external power supply.

According to this invention, there is provided a position detection device, including a thermoelectric conversion portion including a magnetic layer having magnetization and a plurality of electrodes which are made of a material having spin-orbit interaction and are formed on the magnetic layer so as to extend in a direction intersecting a magnetization direction of the magnetic layer, in which the thermoelectric conversion portion modulates an effective temperature in the magnetic layer so as to induce a spin Seebeck effect when an arbitrary location on a layer-surface of the magnetic layer is heated, and generates a voltage corresponding to a heated position from the plurality of electrodes as position information.

MODE FOR EMBODYING THE INVENTION

A position detection device of this invention is a device for specifying two-dimensional coordinates of a heated place on a plane or a heating place on a plane, by utilizing the spin Seebeck effect in which a thermal electromotive force is generated from a temperature gradient. This position detection device basically includes a position detection element (thermoelectric conversion portion) using the spin Seebeck effect.

Further, this invention also proposes a systematic position detection device including a position detection element (thermoelectric conversion portion) and separate heating means for heating an arbitrary location on a plane of the thermoelectric conversion portion, or a position detection device including a thermoelectric conversion portion and integrally formed energy form interface means for receiving various kinds of energy other than thermal energy so that an arbitrary location on a plane generates heat.

The position detection device according to this invention does not need an external power supply.

In other words, it is possible to provide the position detection device that does not need an external power supply with the structure described herein, and it is possible to realize a low standby power touch panel or image sensor with a simple structure. In addition, because it is possible to use an applying process or a printing process, the device is also suited for large area mounting onto a low cost substrate.

First Embodiment

Principle

Figure 25:
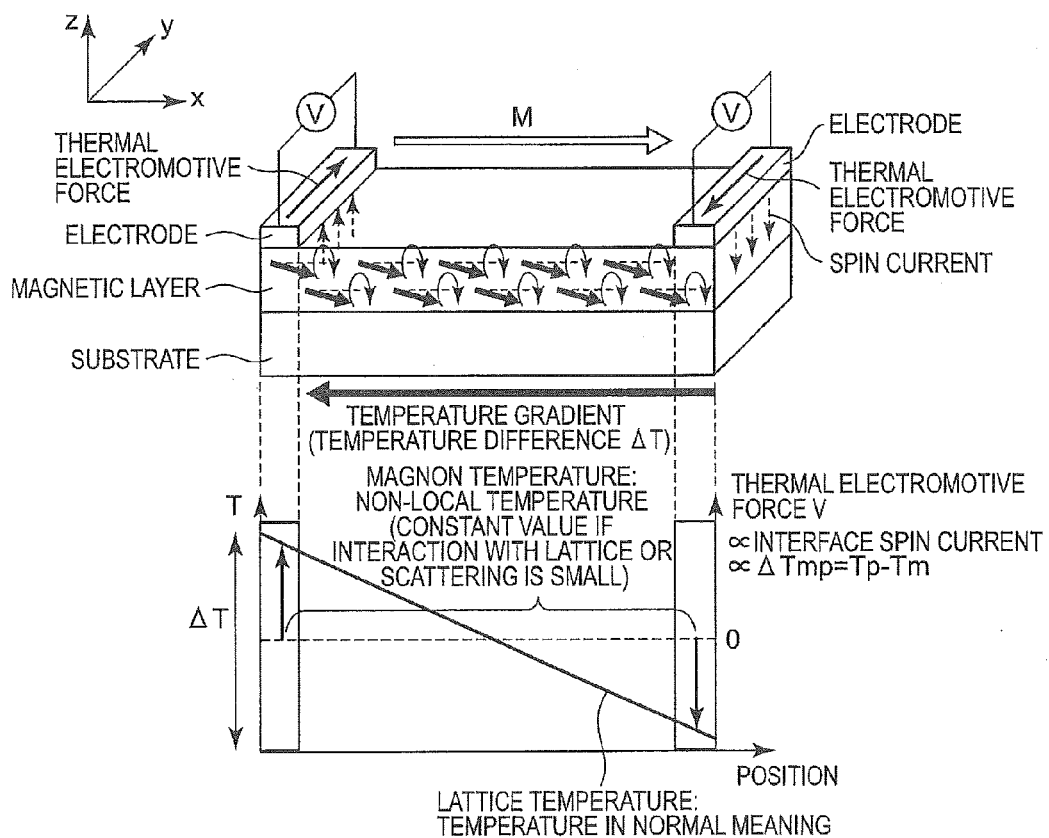
FIG. 25 is a diagram illustrating an operation principle of the spin Seebeck effect as a related art of this invention.

First, the basic structure and principle of the spin Seebeck effect described in Patent Literature 1 are illustrated in FIG. 25. A basic element structure includes a magnetic layer having magnetization formed on a substrate and electrodes disposed on the ends of the magnetic layer. When a temperature gradient in an in-plane direction is applied to this structure, a spin current is induced at an interface between the electrode and the magnetic layer. This spin current is converted into an electric current (electromotive force) by an inverse spin Hall effect in the electrode, and "thermoelectric conversion in which a thermal electromotive force is generated from a temperature difference" becomes possible.

Figure 18:
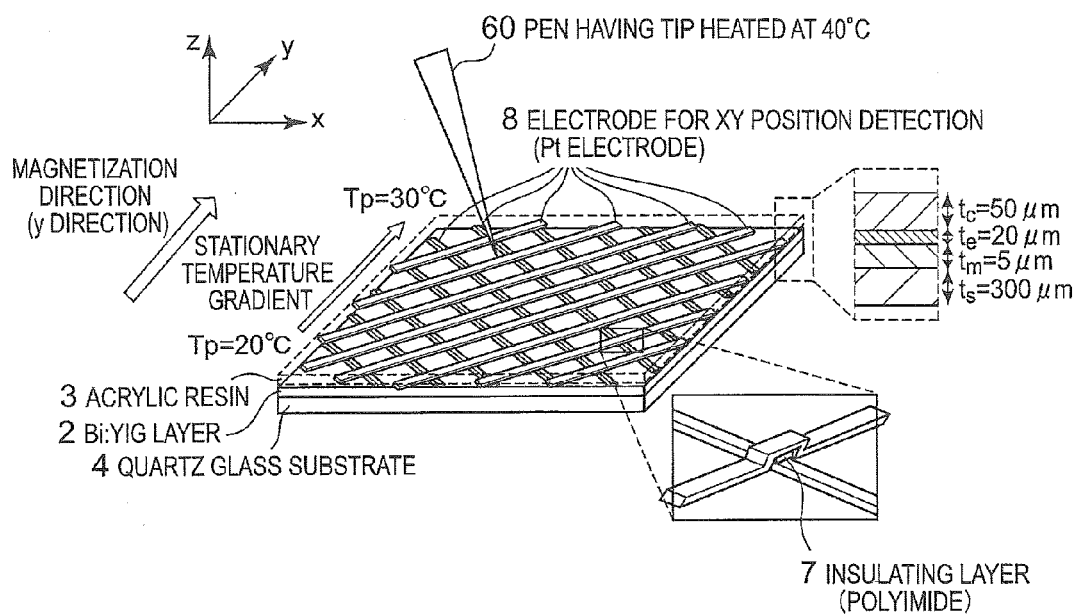
FIG. 18 is a diagram illustrating a position detection device of Example 6 of this invention.

In the microscopic spin Seebeck effect theory described in Non Patent Literature 1 (Physical Review B 81, 214418), it can be understood that this spin current is driven by a temperature difference between "lattice temperature $T_p$" and "magnon temperature $T_m$". Here, the lattice temperature is a parameter ("temperature" in the normal meaning) indicating an amplitude of a lattice vibration (phonon) due to heat, and the magnon temperature corresponds to a parameter indicating an amplitude of thermal fluctuation of a spin. When a temperature difference $\Delta T$ is applied between the ends of the element, the lattice temperature (normal "temperature") changes linearly as illustrated in FIG. 18 if thermal conductivity is uniform in the magnetic material. In contrast, the magnon temperature indicating a spin thermal motion has a distribution different from the lattice temperature, because of the following two reasons: (1) a large number of spins act mutually in an emphasized manner in a ferromagnetic material or a ferrimagnetic material; and (2) magnons in a magnetic insulator such as yttrium iron garnet (YIG) have small interaction with environment (hot bath) (propagate in a non-equilibrium state in the hot bath). In particular, in a state where magnons have small interaction with environment, magnons can move in a magnetic material in a thermal non-equilibrium state with the hot bath without being affected by phonon scattering. Therefore, it can be considered that the magnon temperature has a constant value obtained by averaging a temperature distribution of the entire magnetic material by the simplest approximation.

As a result, as illustrated in FIG. 25, the lattice temperature $T_p$ changes linearly, while the magnon temperature $T_m$ becomes a constant value. Therefore, a large lattice-magnon temperature difference $\Delta T_{mp}=T_p-T_m$ is generated between both ends of the element. Therefore, when electrodes are disposed at both ends of the magnetic layer, an interface spin current is pumped from the magnetic layer to the electrode by the temperature difference $\Delta T_{mp}$ as a drive source, and hence a spin Seebeck signal is generated.

Further, in a power generation use in which the maximum thermal electromotive force is extracted, it is most effective to dispose the electrodes at both ends of the magnetic material as in the above-mentioned literature. However, because the above-mentioned lattice-magnon temperature difference $\Delta T_{mp}$ has a finite value also in a place other than the ends of the magnetic material, it is possible in principle to extract the thermal electromotive force by the electrodes also in a place other than the ends.

[Structure]

In this invention, this spin Seebeck effect is used.

Figure 1:
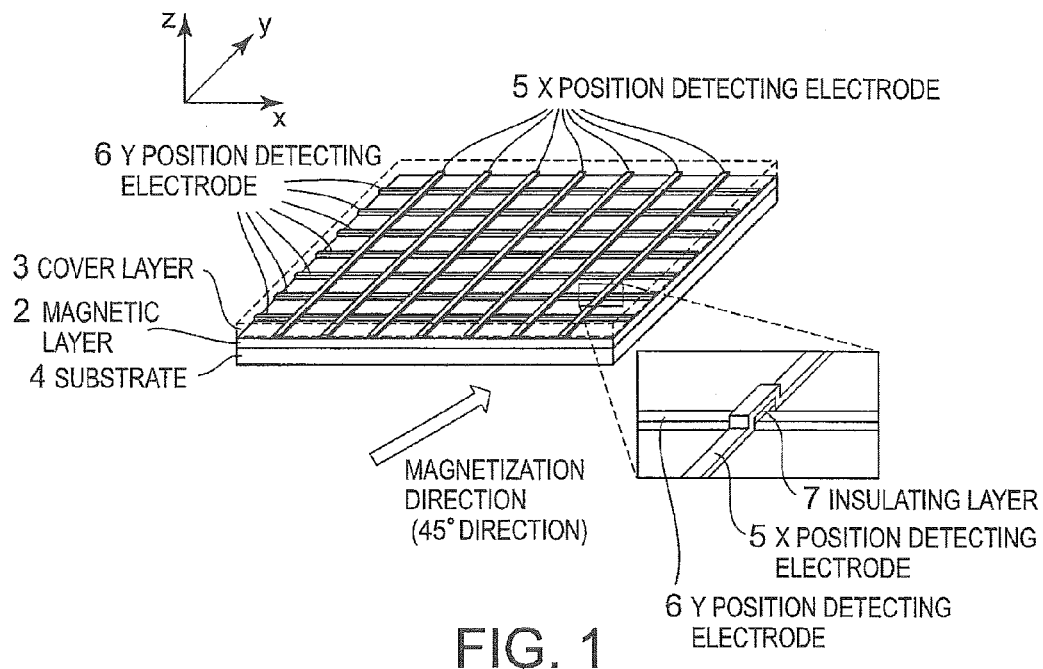
FIG. 1 is a perspective view illustrating a position detection device according to a first embodiment of this invention.

FIG. 1 illustrates a basic device structure of a position detection device according to a first embodiment of this invention. This position detection device includes a thermoelectric conversion portion including a substrate 4, a magnetic layer 2, a plurality of X position detecting electrodes 5 and a plurality of Y position detecting electrodes 6 disposed like a mesh on the magnetic layer 2, an insulating layer 7 for electric insulation between these electrodes, and a cover layer 3 protecting the entire structure. Here, it is assumed that the X position detecting electrodes 5 and the Y position detecting electrodes 6 for detecting a two-dimensional position have a linear shape elongated in a Y direction and in an X direction, respectively, and are disposed in directions substantially perpendicular to each other. In FIG. 1, seven X position detecting electrodes 5 and seven Y position detecting electrodes 6 are disposed as an example (here, from the upper left, electrodes x1 to x7 and electrodes y1 to y7 are defined).

It is assumed that the magnetic layer 2 has magnetization in one direction parallel to a film surface (an XY plane in FIG. 1). In order to satisfy symmetry necessary for expressing the spin Seebeck effect, it is assumed that the magnetic layer 2 has magnetization in a direction having a finite angle with respect to both a longitudinal direction of the X position detecting electrode 5 (Y direction) and a longitudinal direction of the Y position detecting electrode 6 (X direction). Specifically, it is assumed that the magnetization direction is in any one of ranges of 30 to 60° C., 120 to 150 degrees, −30 to −60 degrees, and −120 to −150 degrees in the XY plane. In particular, it is most desired that the magnetization direction be in the middle between the X direction and the Y direction (one of 45 degrees, 135 degrees, −45 degrees, and −135 degrees in the XY plane).

It is desired that a material having small thermal conductivity be used as a material of the magnetic layer 2 for the following two purposes: (1) to generate a high sensitive thermal electromotive force by preventing heat from escaping (by keeping the temperature difference); and (2) to realize a high position detection resolution by suppressing thermal diffusion. Because heat conduction by conduction electrons becomes large in a metal or a semiconductor, a magnetic insulator having small thermal conductivity is used in this embodiment. In particular, by using a magnetic insulator material such as a polycrystalline or nanocrystalline material, it is possible to suppress phonon heat conduction by effective phonon scattering so that higher sensitivity or resolution can be obtained.

As a specific material, an oxide magnetic material such as garnet ferrite or spinel ferrite can be used. This magnetic layer 2 is formed on the substrate 4 by a metalorganic deposition method (MOD method), a sol-gel method, or an aerosol deposition method (AD method), for example. By using the above-mentioned film forming method based on applying or printing, it is possible to form the film all together on a large area substrate so that high productivity can be obtained in the production.

In addition, because a garnet film such as YIG has high transparency in a wide wavelength range, the garnet film is suitable for application as a transparent position input device such as a touch panel.

Further, by using a magnetic material having a coercive force for the magnetic layer 2, it is possible to obtain a device capable of operating under zero magnetic field by initializing the magnetization direction once by an external magnetic field or the like.

The X position detecting electrode 5 and the Y position detecting electrode 6 include a material having a spin-orbit interaction for extracting the thermal electromotive force by using the inverse spin Hall effect. For example, a metal material having a relatively large spin-orbit interaction such as Au, Pt, Pd, or Ir, or an alloy material containing those metal materials is used. In addition, the thermal electromotive force can be extracted also from a material in which a low cost and low resistance metal such as Cu is doped with a small amount (10% or lower) of impurities having the spin-orbit interaction as described above.

The X position detecting electrode 5 and the Y position detecting electrode 6 described above are formed by a method such as sputtering or vapor deposition after patterning by optical lithography or the like. In addition, it is possible to form the X position detecting electrode 5 and the Y position detecting electrode 6 by an ink jet method or a screen print method. Further, in order to prevent continuity between the X position detecting electrode 5 and the Y position detecting electrode 6, the insulating layer 7 is sandwiched at a position where the X position detecting electrode 5 and the Y position detecting electrode 6 intersect each other. Because the insulating layer 7 can be also formed by the print method using a material such as polyimide, it is possible to form all the X position detecting electrode 5, the Y position detecting electrode 6, and the insulating layer 7 by the process based on applying or printing.

Here, in order to convert the spin current into electricity at high efficiency, it is preferred to set the thickness of the electrode to at least a spin diffusion length of the metal material or larger. For example, it is desired to set the thickness to 50 nm or larger for Au and 10 nm or larger for Pt. In addition, in a use of reading the thermal electromotive force by a voltmeter like this embodiment, a larger voltage output can be obtained as the metal film is thinner. Therefore, it is most desired that the thickness of the electrode be approximately the spin diffusion length of the metal material. For example, the thickness is set to approximately 50 to 100 nm for Au and to approximately 10 to 30 nm for Pt.

Details of the material and structure of the cover layer 3 are not limited as long as the X position detecting electrode 5 and the Y position detecting electrode 6 can be protected. For example, by using an organic resin material such as an acrylic resin or polyimide, the cover layer can be formed by a printing or applying process. However, in a use in which sensitivity is important, it is desired to use a material having high thermal conductivity in a direction orthogonal to the surface or a material capable of protecting the device even with a small thickness in order to effectively conduct input heat to the magnetic layer 2, and it is desired to set the thickness to 200 μm or smaller.

As to the substrate 4, in order to prevent noise and malfunction due to heat entering from ambient environment or a temperature fluctuation to the extent possible, it is preferred to use a material having small thermal conductivity or to use a structure having a sufficiently large thickness. More specifically, a thermal resistance in the direction orthogonal to the surface of the substrate 4 is designed to be sufficiently larger than a thermal resistance in the direction orthogonal to the surface of the other layers (the magnetic layer 2 and the cover layer 3).

From the above viewpoints, it is desired to use an insulator material having no heat conduction by conduction electrons for the substrate 4, and it is particularly desired to use an amorphous insulator such as glass having small thermal conductivity or an organic resin material such as polyimide. In addition, it is desired that the thickness of the substrate 4 be at least 50 μm or larger. Further, the substrate 4 can be eliminated in a use environment in which the magnetic layer 2 can be directly fixed and can be stably used.

[Operation]

Figure 2:
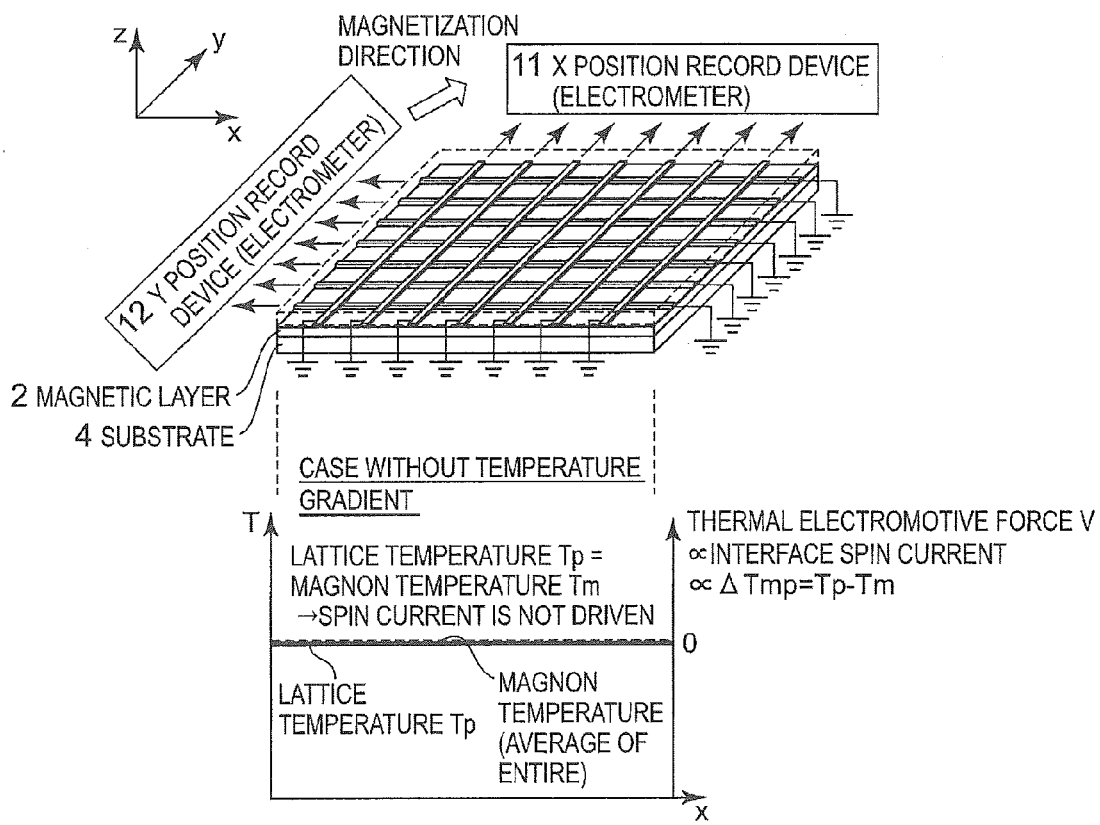
FIG. 2 is a diagram illustrating a standby state of the position detection device illustrated in FIG. 1.

An operation method for this position detection device is described with reference to FIG. 2. In order to detect the position information, it is necessary to evaluate a thermal electromotive force (potential difference or current) generated in each of the X position detecting electrodes 5 and the Y position detecting electrodes 6. Various evaluation methods can be adopted. In FIG. 2, in each of the X position detecting electrodes 5 and the Y position detecting electrodes 6, one side is connected to the ground (reference potential), and the other side is connected to an X position record device 11 and a Y position record device 12, which can measure and record voltages. Thus, the thermal electromotive force ($V_{x1}$ to $V_{x7}$, $V_{y1}$ to $V_{y7}$) generated between one end of the electrode and the ground by the spin Seebeck effect can be recorded as a voltage signal externally.

This spin Seebeck phenomenon is microscopically driven by a lattice-magnon temperature difference $\Delta Tmp$ as described above. Therefore, it can be considered that the amplitude of the thermal electromotive force ($V_{x1}$ to $V_{x7}$, $V_{y1}$ to $V_{y7}$) is proportional to the temperature difference $\Delta Tmp$ under the condition of a constant parameter such as the width or the length.

First, in a constant temperature state in which the temperature gradient is not applied as illustrated in FIG. 2, the lattice temperature and the magnon temperature have the same constant value. Therefore, the spin current due to the lattice-magnon temperature difference $\Delta Tmp$ is not driven, and the thermal electromotive force is not generated ($V_{x1}$ to $V_{x7}=V_{y1}$ to $V_{y7}=0$ V).

Figure 3:
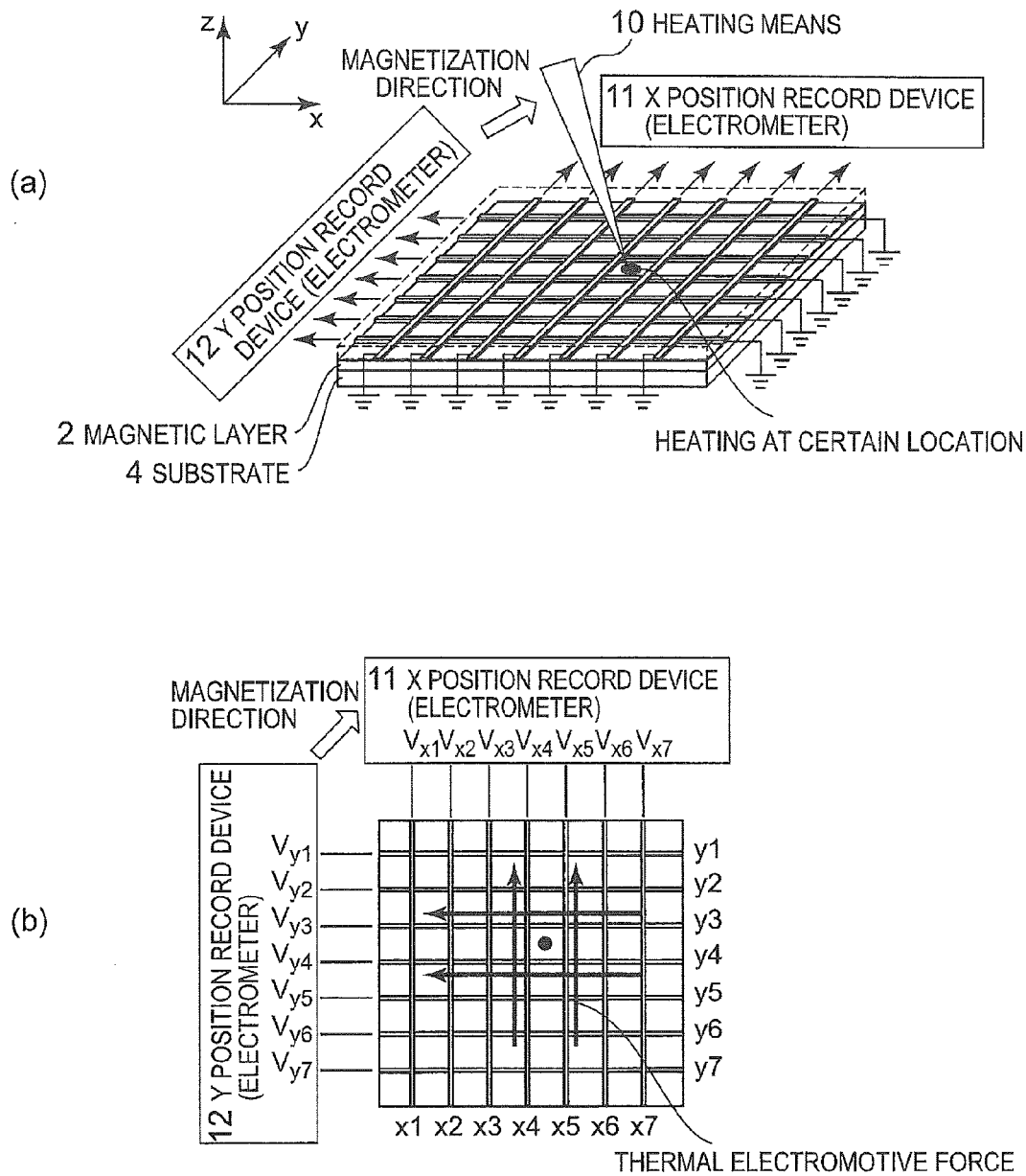
FIG. 3 is comprised of diagrams (a) and (b) illustrating an input operation of the position detection device illustrated in FIG. 1.

Here, as illustrated in FIG. 3, when a part of the magnetic layer 2 is heated by external heating means 10 as position information input means separately from the position detection element (thermoelectric conversion portion), the lattice temperature locally changes so that a temperature gradient is generated in the vicinity. Thus, a spin current due to the spin Seebeck effect is induced. This spin current flows into the closest X position detecting electrode 5 and Y position detecting electrode 6, and is converted into an electromotive force in the direction perpendicular to the magnetization direction of the magnetic layer 2 by the inverse spin Hall effect in the electrodes. This electromotive force is measured by an external electrometer, and hence it is possible to specify the two-dimensional coordinates at which the heat is generated. Note that, "heating" in this invention includes "cooling" as negative heating.

Figure 4:
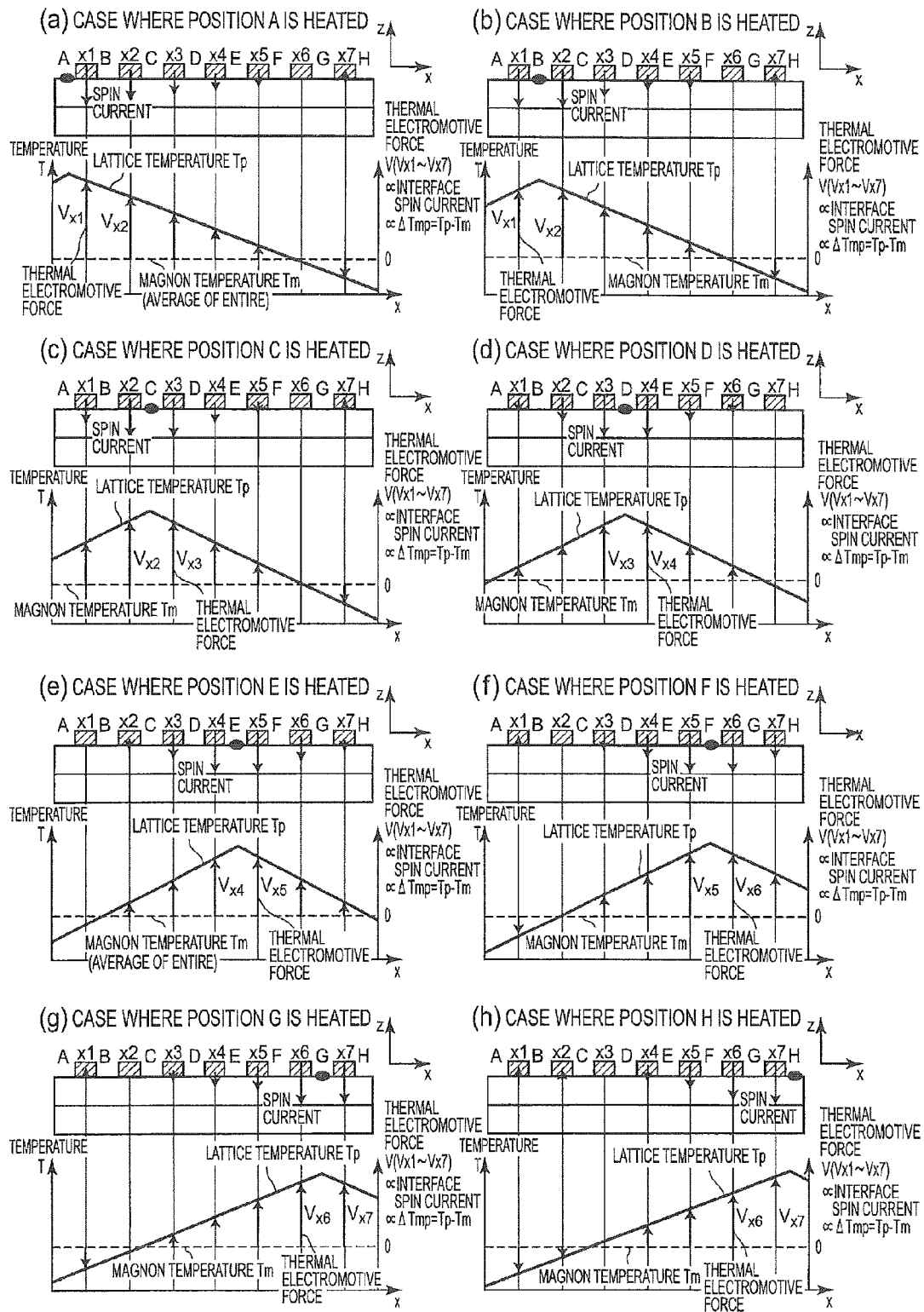
FIG. 4 is comprised of graphs (a) to (h) showing electromotive force distributions in electrodes x1 to x7 when positions A to H are heated respectively in the first embodiment.

A specific example of generating the thermal electromotive force corresponding to a heated position is illustrated in FIG. 4. The upper part of each of FIGS. 4(a) to 4(h) shows a cross-sectional view of an xz plane including a heated point in cases where heat is generated at different X positions (A to H), respectively. On the other hand, the graph in the lower part of each of FIGS. 4(a) to 4(h) shows distributions of the lattice temperature Tp and the magnon temperature Tm in the magnetic layer of the xz cross section, in which the horizontal axis represents the X position. Here, a boundary condition is assumed in which the thermal conductivity is uniform in the magnetic layer 2 and a constant heat flow escapes from the end. As illustrated in this graph, it is assumed that the lattice temperature has a large value when heat is generated, while the magnon temperature has a uniform value as an average value in the entire magnetic material. Therefore, a temperature difference is generated between the lattice temperature and the magnon temperature.

Figure 5:
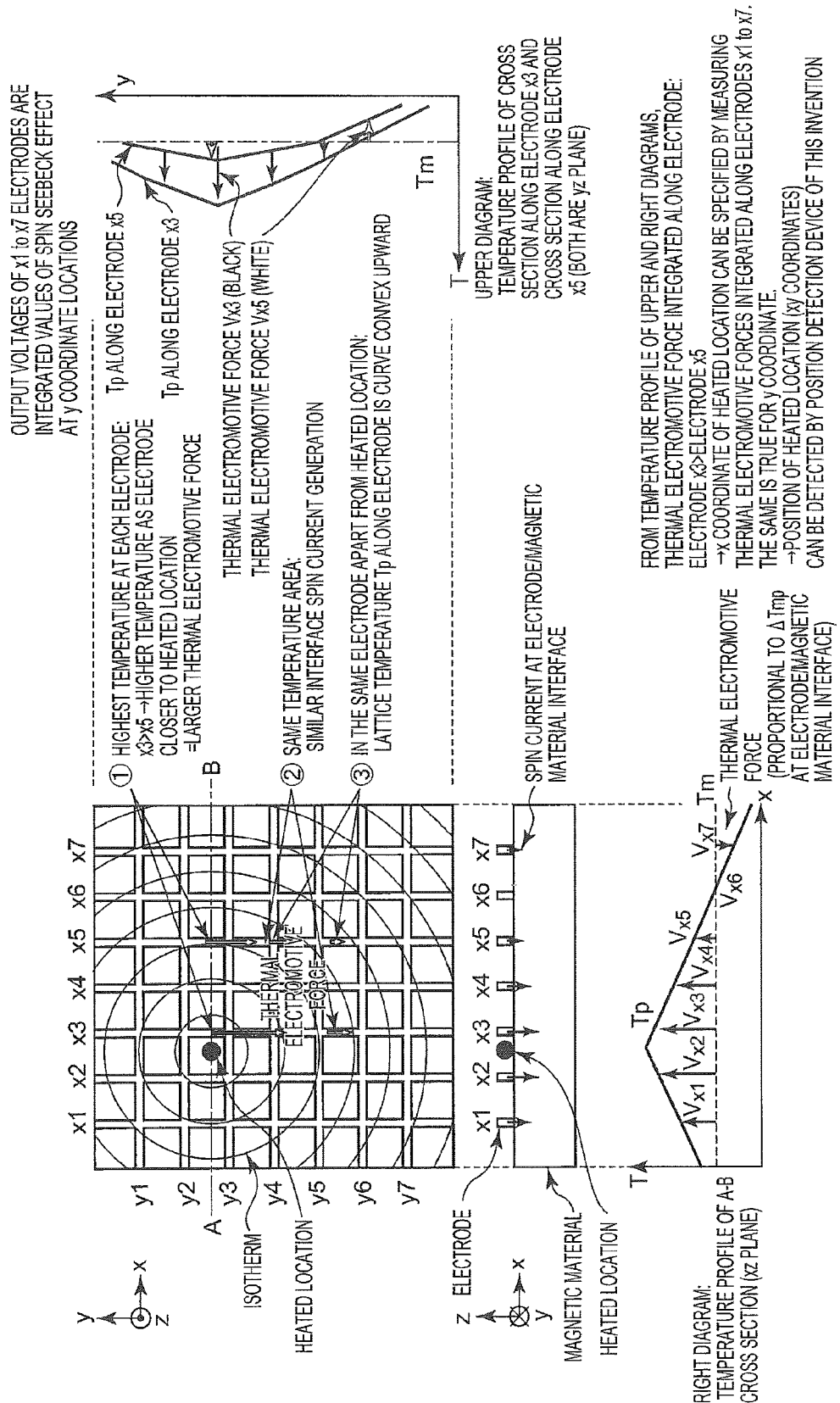
FIG. 5 is a diagram illustrating generation of a thermal electromotive force when a position between the electrode x3 and the electrode x4 is heated in the first embodiment.

Thus, the spin current is driven by an electrode/magnetic material interface, and the thermal electromotive force proportional to the lattice-magnon temperature difference is generated in each of the X position detecting electrodes 5 (electrodes x1 to x7). Note that, FIG. 4 specifically show the distributions of the lattice temperature and the magnon temperature and the thermal spin current due to the distributions in an XZ cross section including the heated part. However, an output voltage generated actually between the ends of the X position detecting electrode 5 and the Y position detecting electrode 6 is a signal in which the spin Seebeck effect is accumulated in the entire magnetic layer (see FIG. 5). Note that, in the XZ cross section apart from the heated point, because no large temperature gradient is generated, the thermal electromotive force contributing to measurement is also small.

Here, as understood from comparison among FIGS. 4(a) to 4(h), the electromotive force distributions generated in the electrodes x1 to x7 are greatly different depending on the position where heat is generated. Therefore, by measuring and recording the electromotive force distribution by the X position record device 11 and by analyzing and estimating the lattice temperature distribution from the electromotive force distribution, it is possible to determine the X position at which heat is generated.

Figure 6:
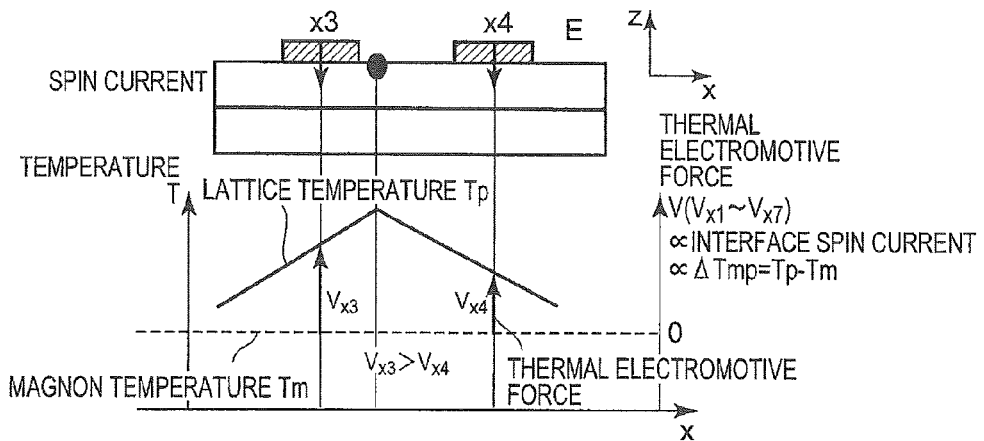
FIG. 6 is comprised of graphs (a) to (c) showing temperature distributions and thermal electromotive force distributions in a plane of a magnetic material in the first embodiment.
Figure 6:
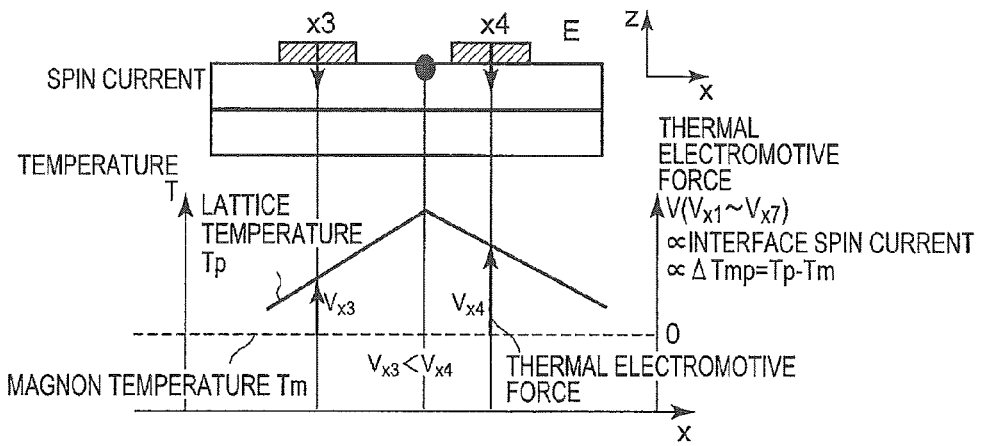
Figure 6:
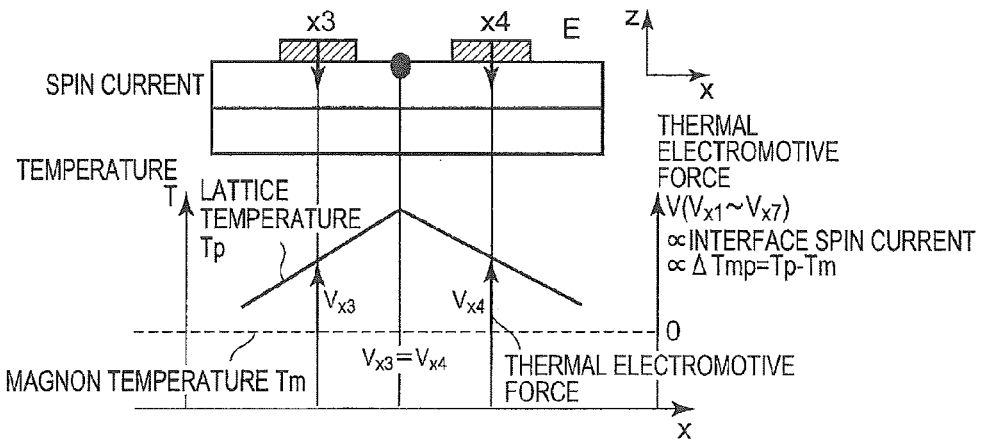

Note that, FIG. 4 show only a typical position detection example, but actually it is possible to perform finer (high resolution) position detection. For example, as shown in FIG. 6, it is assumed that a certain point between the electrode x3 and the electrode x4 is heated. In this case, the thermal electromotive forces $V_{x3}$ and $V_{x4}$ are noted. (a) If a point closer to the electrode x3 is heated, $V_{x3}>V_{x4}$ holds. (b) If a point closer to the electrode x4 is heated, $V_{x3}<V_{x4}$ holds. (c) If a midpoint between the electrode x3 and the electrode x4, $V_{x3}=V_{x4}$ holds. In this way, by checking the amplitudes of $V_{x3}$ and $V_{x4}$, it is possible to specify a finer position between the electrode x3 and the electrode x4.

The measurement procedure in the X position is described above, but the same lattice-magnon temperature difference distribution is generated also in the Y direction. Therefore, the measurement of the thermal electromotive force distribution as illustrated in FIG. 4 can also be performed in the Y position detecting electrodes 6 (electrodes y1 to y7) simultaneously. Thus, by the same procedure as described above, a y position at which heat is generated can be detected and can be recorded by the Y position record device 12.

Note that, a linear temperature distribution having the highest temperature at the heated position is assumed in FIG. 4, but the temperature distribution that can be detected by this invention is not limited to this. For example, it is possible that a part heated by a heat source may have a finite size. In addition, the temperature distribution can be detected by the same method even if the distribution has a plurality of maximum peaks and minimum peaks.

In this way, a two-dimensional position where heat is generated can be specified from X and Y position information measured by the X position record device 11 and the Y position record device 12. Because any heating means 10 can be used as long as the heating means 10 has heat, a finger having body temperature or a pen having a heated tip can be used for inputting position information. Because it is not necessary to apply a bias such as a voltage in a standby state, it is possible to use for a user interface having extremely small standby power.

Note that, because the operation principle of position input in this embodiment involves locally changing a temperature distribution of the magnetic layer, it is possible to use cooling means instead of the heating means 10. For example, the position detection device is attached to a high temperature heat source such as IT equipment so as to be heated in advance, and cooling means at room temperature is caused to approach the position detection device externally. Thus, the temperature distribution can be locally changed.

Example 1

Figure 7:
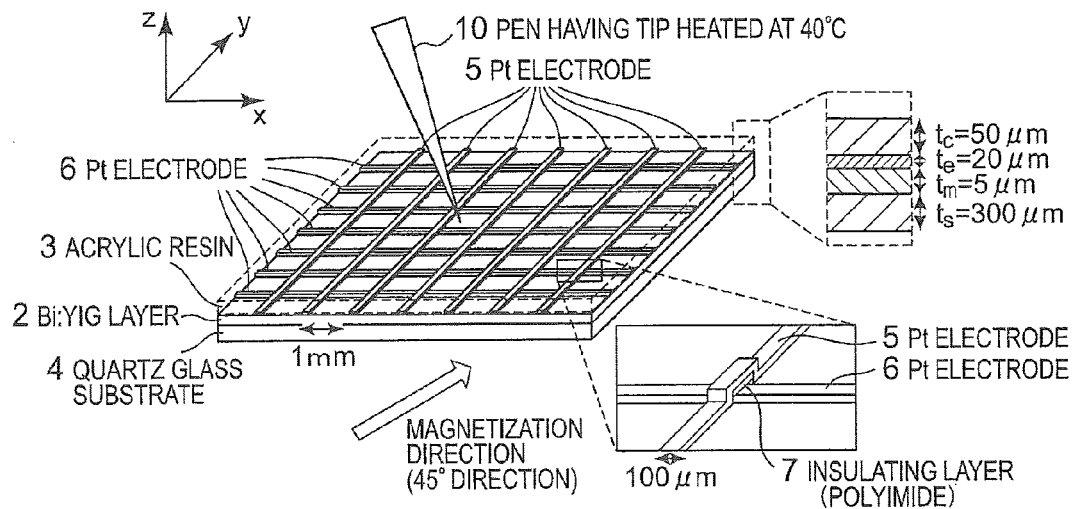
FIG. 7 is a diagram illustrating a position detection device of Example 1 of this invention.

FIG. 7 illustrates a specific example of this invention.

In this example, as the magnetic layer 2, an yttrium iron garnet film is used, in which a part of Y-site is replaced with Bi (hereinafter referred to as Bi:YIG film, in a composition of $BiY_2Fe_5O_{12}$). Pt is used for the X position detecting electrode 5 and the Y position detecting electrode 6. Here, the Bi:YIG film has a thickness of 5 μm, and the Pt electrode has a thickness of 20 nm. In addition, each Pt electrode has a line shape having a line width of 100 μm, and an interval between the electrodes is 1 mm.

A quartz glass substrate having a thickness of 300 μm is used as the substrate 4, and an acrylic resin having a thickness of 50 μm is used as the cover layer 3. A polyimide resin is used as the insulating layer 7. As the heating means 10 as a separate body from the thermoelectric conversion portion, a pen having the tip heated at 40° C. is used.

The magnetic layer 2 made of Bi:YIG is formed by an aerosol deposition method. As a raw material of Bi:YIG, fine grains of Bi:YIG having a diameter of 300 nm are used. The fine grains of Bi:YIG are filled in an aerosol generating container, and the glass substrate 4 is fixed to a holder in a film forming chamber. In this state, a pressure difference is generated between the film forming chamber and the aerosol generating container, so that the fine grains of Bi:YIG are sucked into the film forming chamber and are sprayed onto the substrate through a nozzle. In this case, collision energy on the substrate causes the fine grains to be milled and recombined so that Bi:YIG polycrystalline is formed on the glass substrate 4. By scanning the substrate stage in a two-dimensional manner, a uniform Bi:YIG magnetic layer 2 having a thickness of 5 μm is formed on the substrate.

After that, the surface of the magnetic layer 2 is polished if necessary, and then the Pt electrodes 5 and 6 and the insulating layer 7 are all formed by the ink jet method. Specifically, ink containing Pt is applied in a line shape by the ink jet device and is dried so as to form the Pt electrode 6. Then, the polyimide insulating layer 7 is deposited by the ink jet at the position where the Pt electrode 6 intersects the Pt electrode 5. After that, the Pt electrode 5 is formed similarly by the ink jet.

Finally, organic solution in which polymethyl methacrylate is dissolved as an acrylic material is applied onto the resultant structure and is dried at high temperature of approximately 100° C. so that the cover layer 3 having a thickness of 50 μm is formed.

Second to Fifth Embodiments

In the first embodiment, as the position information input means for inputting position information, the heating means 10 is used, which heats an arbitrary location on the plane of the thermoelectric conversion portion separately from the position detection element (thermoelectric conversion portion). However, this invention is not limited to this systematic device. In other words, according to this invention, when the energy form interface means for heating an arbitrary location on the plane when receiving an external trigger in various energy forms is provided (embedded) as the position information input means integrally with the position detection element (thermoelectric conversion portion), the input of position information can be realized by the external trigger in various energy forms.

Actually, heat is the most general energy form, and various kinds of energy such as an electromagnetic wave and vibration finally become heat in many cases. Further, a chemical reaction between substances or a phase change also generates heat.

Therefore, by application of the heat sensor array (position detection element) described above in the first embodiment, various forms of sensor arrays can be constituted. Applications to an electromagnetic wave sensor array, a contact (friction heat) detection sensor, a gas sensor array, and the like are hereinafter described.

Second Embodiment

Electromagnetic Wave Sensor Array

Figure 8:
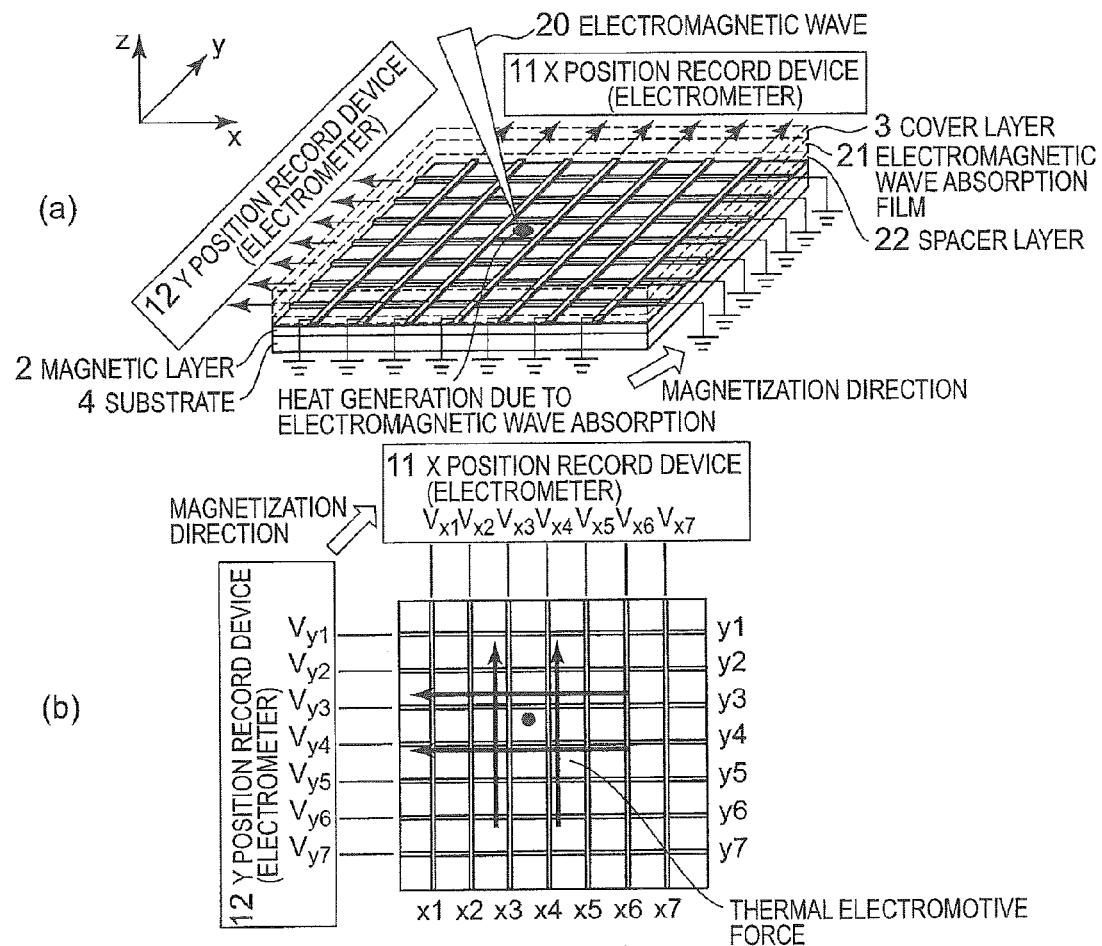
FIG. 8 is comprised of perspective views (a) and (b) illustrating a position detection device according to a second embodiment of this invention.

FIG. 8 illustrate perspective views of the electromagnetic wave sensor array according to a second embodiment of this invention. The difference from the position detection device of the first embodiment is that an electromagnetic wave detection portion including an electromagnetic wave absorption layer 21 is disposed on the electrode/magnetic layer of the position detection element (thermoelectric conversion portion) via a spacer layer 22 made of an insulation material.

When the electromagnetic wave sensor array having this structure is irradiated with an electromagnetic wave 20 from the outside as illustrated in FIG. 8, the electromagnetic wave 20 is absorbed by the electromagnetic wave absorption layer 21, and heat is generated at the position. A thermal electromotive force due to this heat generation is measured and recorded by the X position record device 11 and the Y position record device 12, and hence the two-dimensional position which is irradiated with the electromagnetic wave can be specified.

Here, a material that absorbs the electromagnetic wave 20 well to generate heat is used as the electromagnetic wave absorption layer 21. Selection of the specific material depends on the wavelength. For example, for infrared rays, a gold black film (ultrafine particle film of gold) or a nickel chrome alloy film can be used and for visible light, a $Cu(In,Ga)Se_2$(CIGS) film or a fullerene film can be used. In addition, a carbon film made of carbon black or carbon nanotube is also suitable for being formed by applying or printing, and can be used in a wide range from infrared to visible light.

The spacer layer 22 works as an insulating layer for not preventing an operation for generating the thermal electromotive force in the electrodes 5 and 6. If the electromagnetic wave absorption layer 21 itself is an insulator, the spacer layer 22 can be eliminated.

A material that can transmit the electromagnetic wave 20 as much as possible is used for the cover layer 3. If necessary, a wavelength filter is disposed above the cover layer 3 so as to detect only a specific wavelength. In addition, a partial reflection mirror can be disposed above the cover layer 3, and the thickness of the cover layer 3 is optimized so as to constitute a resonator that functions for a specific wavelength. Thus, electromagnetic wave detection sensitivity can be improved. Specifically, a thickness tc of the cover layer is set to satisfy $tc=\lambda/(4n)$, where $\lambda$ represents a wavelength of the electromagnetic wave to be detected, and n represents a refractive index of the material of the cover layer.

Note that, in an application where sensitivity is important, it is desired to use a material having large thermal conductivity in the direction orthogonal to the plane or a material capable of protecting the device even with a small thickness, for the electromagnetic wave absorption layer 21, the spacer layer 22, and the cover layer 3, in order to transfer the input heat effectively to the magnetic layer 2. It is desired that the thickness of each film be 100 μm or smaller. As more desired forms to satisfy both the sensitivity and the resolution, a material and a structure are adopted, which has high heat conduction in the direction orthogonal to the plane and low heat conduction in the in-plane direction. Specifically, an anisotropic heat conduction structure is realized by using a material in which fillers such as carbon fibers oriented in the direction orthogonal to the plane are embedded, or by using a structure in which the material is divided (notched) for each pixel in the plane.

Based on the principle described above, application to an image sensor or the like that does not need an external power supply can be realized with an extremely simple device structure.

Example 2

Figure 9:
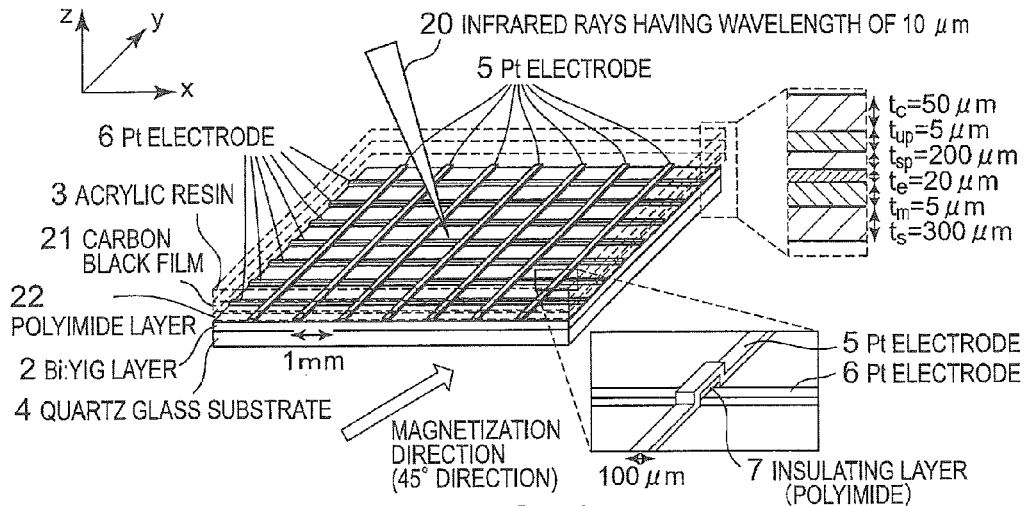
FIG. 9 is a diagram illustrating the position detection device illustrated in FIG. 8.

FIG. 9 illustrates a specific example of this invention.

In this example, as the magnetic layer 2, an yttrium iron garnet film is used, in which a part of Y-site is replaced with Bi (hereinafter referred to as Bi:YIG film, in a composition of $BiY_2Fe_5O_{12}$). Pt is used for the X position detecting electrode 5 and the Y position detecting electrode 6. Here, the Bi:YIG film has a thickness of 5 μm, and the Pt electrode has a thickness of 20 nm. In addition, each Pt electrode has a line shape having a line width of 100 μm, and an interval between the electrodes is 1 mm.

Here, infrared rays having a wavelength of approximately 10 μm are used as the electromagnetic wave 20. A carbon black film capable of effectively absorbing the electromagnetic wave having this wavelength is used as the electromagnetic wave absorption layer 21. The thickness is set to 200 nm. A quartz glass substrate having a thickness of 300 μm is used as the substrate 4, a polyimide layer having a thickness of 200 nm is used as the spacer layer, and an acrylic resin having a thickness of 50 μm is used as the cover layer 3. A polyimide resin is used as the insulating layer 7.

The magnetic layer 2 made of Bi:YIG is formed by an aerosol deposition method in a manner similar to Example 1. After that, the surface of the magnetic layer 2 is polished if necessary, and then the Pt electrodes 5 and 6 and the insulating layer 7 are all formed by the ink jet method. After that, the polyimide layer 22 having a thickness of 200 nm is formed by applying and drying raw material solution. Further, the carbon black film 21 having a thickness of 200 nm as the electromagnetic wave absorption layer is applied and formed on the entire polyimide layer 22 by spin coating of the raw material. Finally, on the carbon black film 21, organic solution in which polymethyl methacrylate is dissolved as the acrylic material is applied and is dried at high temperature of approximately 100° C., so as to form the cover layer 3 having a thickness of 50 μm. By using the infrared sensor array having this structure, it is possible to constitute a monitoring infrared camera or a thermography with an extremely simple structure.

Third Embodiment

Contact Detection Sensor (Friction Heat Sensor) Array

Figure 10:
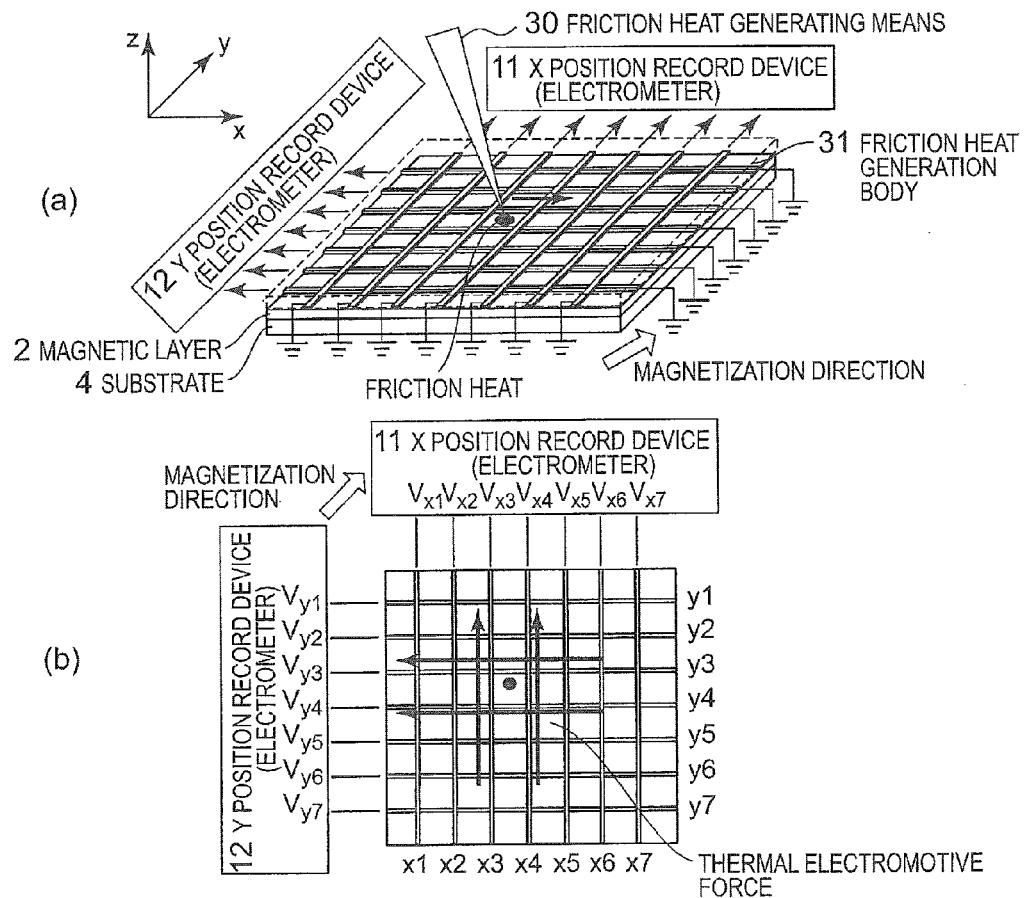
FIG. 10 is comprised of perspective views (a) and (b) illustrating a position detection device according to a third embodiment of this invention.

FIG. 10 illustrate perspective views of a contact detection sensor (or a friction heat sensor) according to a third embodiment of this invention. This device includes a friction detection portion including a friction heat generating layer 31 instead of the cover layer 3 in the position detection device described above in the first embodiment. Similarly to the second embodiment, the spacer layer 22 is inserted if necessary.

When friction applying means (friction heat generating means) 30 is brought into contact with the contact detection sensor having the structure described above by rubbing a part of the friction heat generating layer 31 as illustrated in FIG. 10, heat is generated at a contact portion of the friction heat generating layer 31. This heat is detected by the position detection device described above in the first embodiment, and hence a two-dimensional position of the contact can be measured and recorded.

The surface of the friction heat generating layer 31 is appropriately processed so that heat is generated by the contact with the friction applying means 30. In addition, in order to efficiently transfer the heat generated on the surface to the magnetic layer 2, it is desired that the friction heat generating layer 31 be as thin as possible in the range such as to function as the protection film or the friction heat generating layer 31 be faulted of a material having high thermal conductivity.

By using this device, it is possible to realize a user interface that does not need an external power supply and has zero standby power. For example, it is possible to input characters or the like by rubbing the friction heat generating layer 31 with a pen.

Note that, the method of generating the friction heat is not limited to the method described above. As another embodiment, for example, it is possible to constitute a position detection device using a load or an impact as the friction applying means 30 by constituting a mechanical component that generates friction heat by external pressure or vibration as the friction heat generating layer 31.

Example 3

Figure 11:
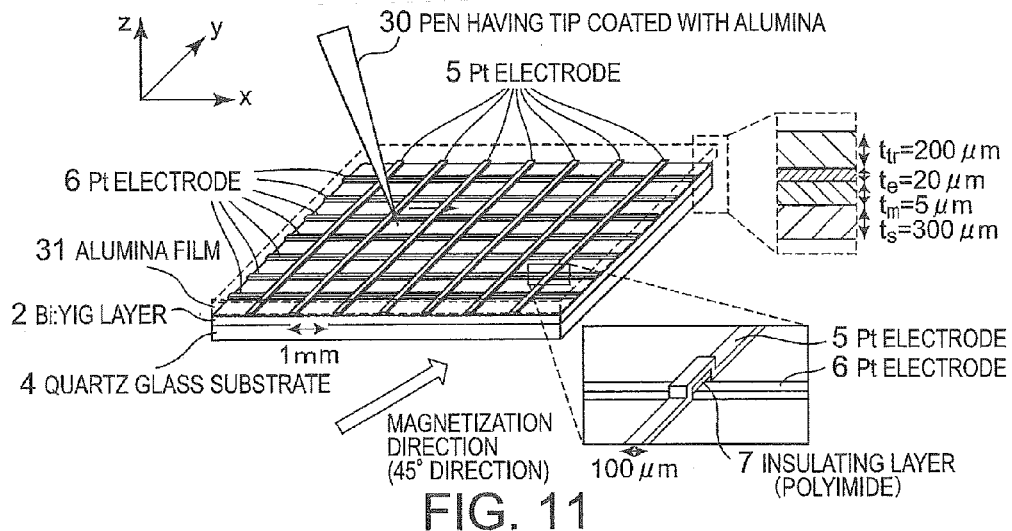
FIG. 11 is a diagram illustrating a position detection device of an embodiment of Example 3 of this invention.

FIG. 11 illustrates a specific example of this invention.

In this example, as the magnetic layer 2, an yttrium iron garnet film is used, in which a part of Y-site is replaced with Bi (hereinafter referred to as Bi:YIG film, in a composition of $BiY_2Fe_5O_{12}$). Pt is used for the X position detecting electrode 5 and the Y position detecting electrode 6. Here, the Bi:YIG film has a thickness of 5 μm, and the Pt electrode has a thickness of 20 nm. In addition, each Pt electrode has a line shape having a line width of 100 μm, and an interval between the electrodes is 1 mm.

Here, an alumina film having a rough surface with small bumps and dips is used as the friction heat generating layer 31. The thickness is set to 200 nm. A pen having the tip coated with alumina is used as the friction applying means 30. A quartz glass substrate having a thickness of 300 μm is used as the substrate 4, and a polyimide resin is used for the insulating layer 7.

The magnetic layer 2 made of Bi:YIG is formed by an aerosol deposition method in a manner similar to Example 1. After that, the surface of the magnetic layer 2 is polished if necessary, and then the Pt electrodes 5 and 6 and the insulating layer 7 are all formed by the ink jet method. Further, on the resultant structure, alumina fine grains having a diameter of 1 μm are adhered and deposited by the aerosol deposition method so that the alumina film 31 is formed. In this case, the surface of the alumina film 31 has appropriate bumps and dips of a few hundreds μm order reflecting on the size of the raw material fine grains. Therefore, a roughening treatment is not particularly necessary.

Fourth Embodiment

Floating Substance Sensor Array

Figure 12:
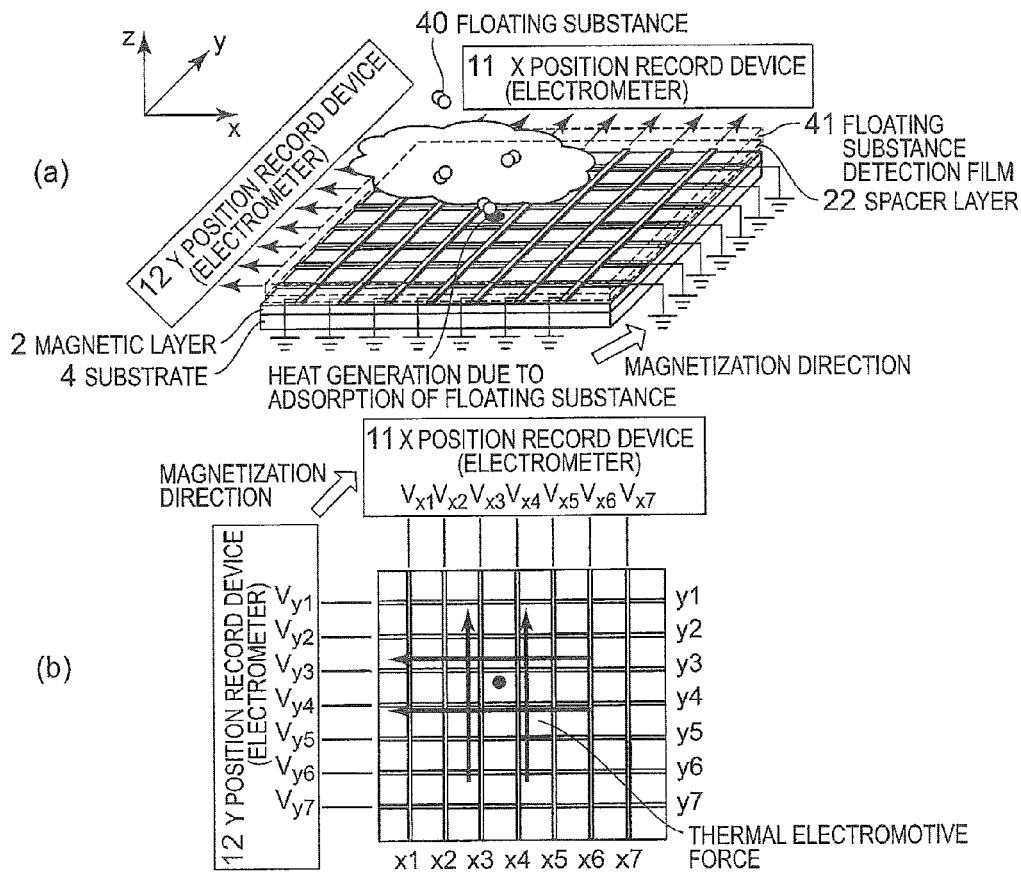
FIG. 12 is comprised of diagrams (a) and (b) illustrating a position detection device according to a fourth embodiment of this invention.

FIG. 12 illustrate perspective views of a floating substance sensor array according to a fourth embodiment of this invention. The difference from the first embodiment is that there is provided a floating substance detection portion that includes a floating substance detection film 41 for adsorbing a floating substance, and is disposed on the electrode/magnetic layer via the spacer layer 22 as the insulation material.

A known chemical material can be used for the floating substance detection film 41, for example, a catalyst in which a chemical reaction with heat generation occurs when a specific floating substance 40 is adsorbed thereto. Other than that, it is possible to use a film including a porous medium containing the catalyst. The spacer layer 22 works as an insulating layer for not preventing an operation of generating the thermal electromotive force in the electrodes 5 and 6, but is not always necessary depending on the floating substance detection film 41 to be used. In addition, the magnetic layer 2 or the electrodes 5 and 6 can be used directly as the floating substance detection film depending on the gas.

If the floating substance 40 such as gas comes flying from the outside to the floating substance sensor array having the structure described above, heat due to the chemical reaction is generated at a point where the floating substance 40 is adsorbed by the floating substance detection film 41, and hence a part of the magnetic layer 2 is heated. This heat is detected by the position detection device described above in the first embodiment, and hence the two-dimensional position at which the floating substance is adsorbed can be measured and recorded.

Accordingly, a large area floating substance sensor array or the like that does not need an external power supply can be realized with a simple structure. Note that, the floating substance 40 is not limited to gas but may be assumed to be liquid or solid (dust) in an actual case. In addition, the details of the principle of the floating substance detection are not limited as long as heat is generated due to adsorption of the floating substance.

Example 4

Figure 13:
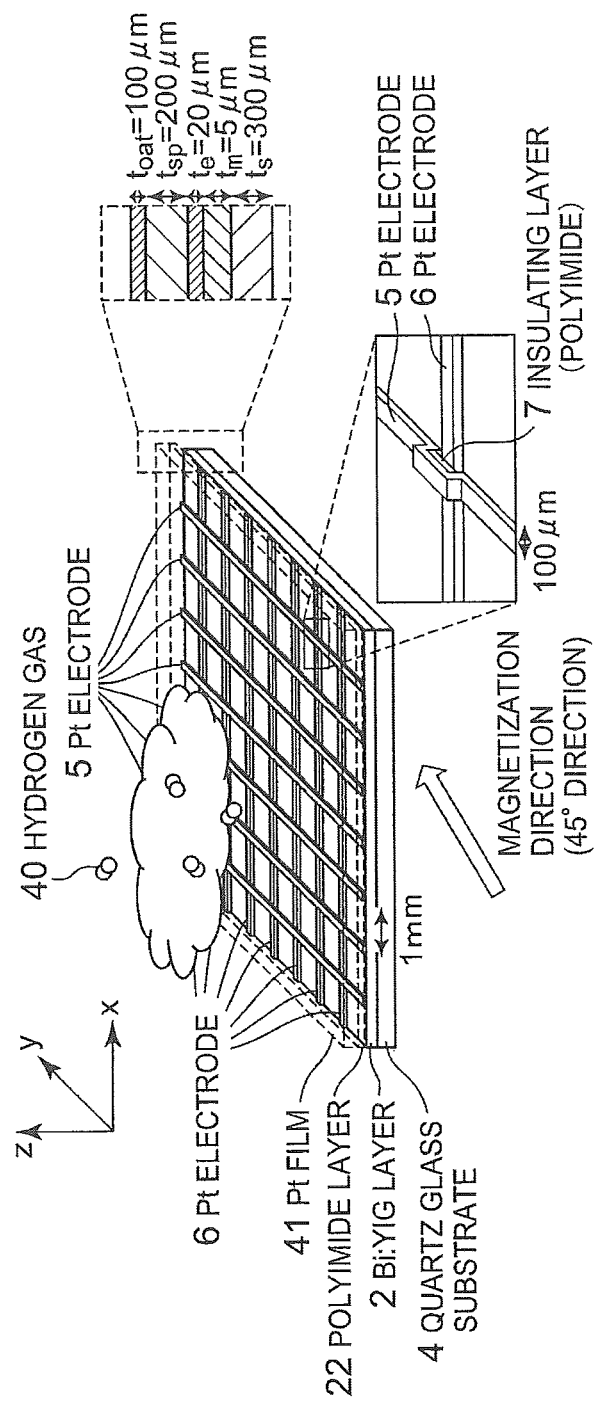
FIG. 13 is a diagram illustrating a position detection device of an embodiment of Example 4 of this invention.

FIG. 13 illustrates a specific example of this invention.

In this example, as the magnetic layer 2, an yttrium iron garnet film is used, in which a part of Y-site is replaced with Bi (hereinafter referred to as Bi:YIG film, in a composition of $BiY_2Fe_5O_{12}$). Pt is used for the X position detecting electrode 5 and the Y position detecting electrode 6. Here, the Bi:YIG film has a thickness of 5 µm, and the Pt electrode has a thickness of 20 nm. In addition, each Pt electrode has a line shape having a line width of 100 µm, and an interval between the electrodes is 1 mm.

Here, hydrogen is assumed as the floating substance 40, and a Pt film having a thickness of 100 nm is used as the floating substance detection film 41. A quartz glass substrate having a thickness of 300 µm is used as the substrate 4, a polyimide layer having a thickness of 200 µm is used as the spacer layer 22, and an acrylic resin having a thickness of 50 µm is used as the cover layer 3. A polyimide resin is used as the insulating layer 7.

The magnetic layer 2 made of Bi:YIG is formed by an aerosol deposition method in a manner similar to Example 1. After that, the surface of the magnetic layer 2 is polished if necessary, and then the Pt electrodes 5 and 6 and the insulating layer 7 are all formed by the ink jet method. Further, on the resultant structure, a polyimide layer having a thickness of 200 nm is formed by applying and drying. After that, the Pt film 41 is formed by sputtering. Finally, organic solution in which an acrylic material is dissolved is applied on the Pt film and is dried at high temperature of approximately 100° C. so as to form the acrylic resin layer 3 having a thickness of 50 µm.

Fifth Embodiment

Pressure Sensor Array

Figure 14:
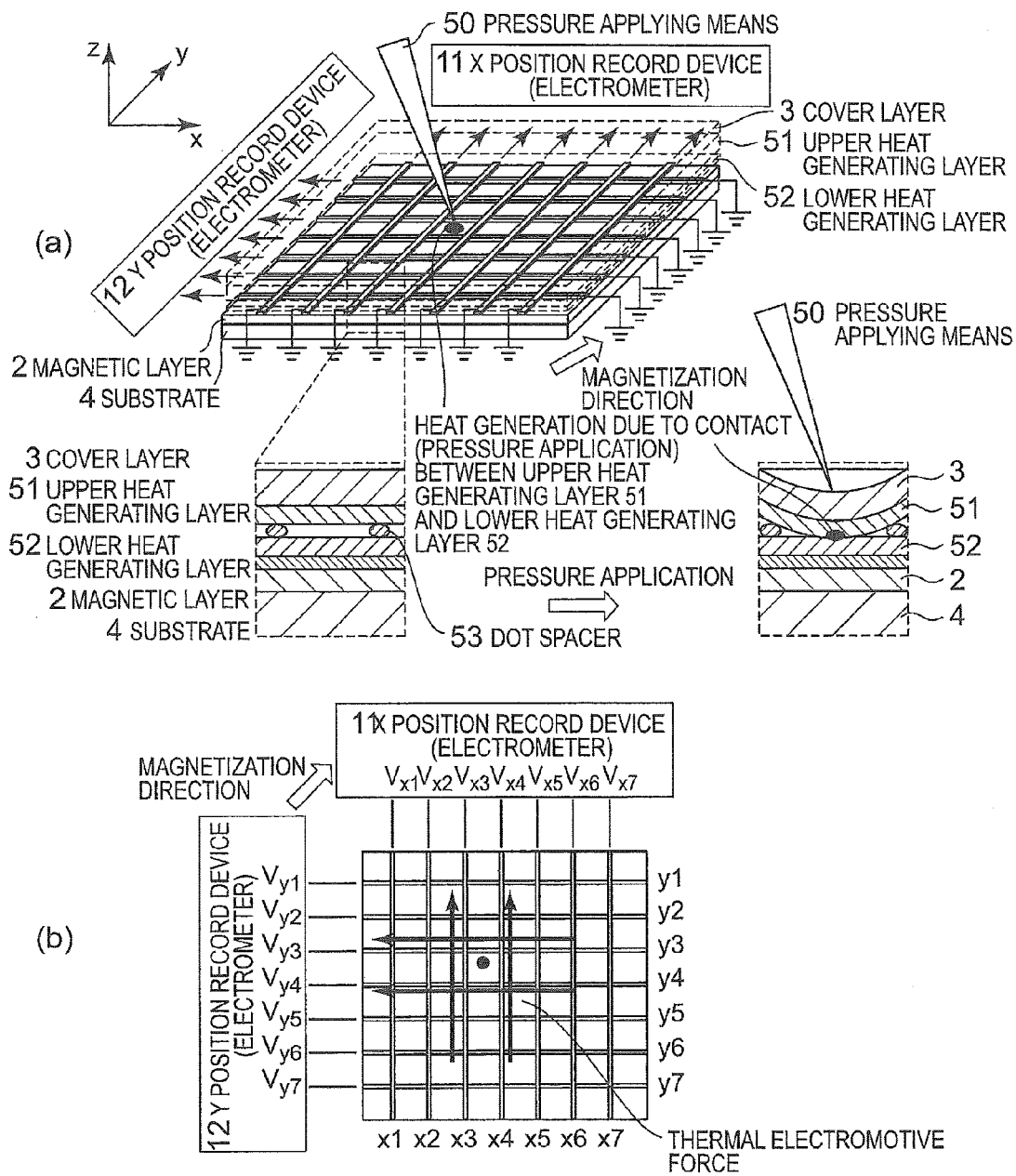
FIG. 14 is comprised of diagrams (a) and (b) illustrating a position detection device according to a fifth embodiment of this invention.

FIG. 14 illustrate a position detection device according to a fifth embodiment of this invention. The difference from the embodiments described above is that a pressure detection portion including a heat generating layer constituted of an upper heat generating layer 51 and a lower heat generating layer 52 that are disposed via dot spacers 53 is provided on the magnetic layer 2.

Here, a combination of materials that generate heat by the contact with each other is used for the upper heat generating layer 51 and the lower heat generating layer 52. In addition, at least the upper heat generating layer 51 and the cover layer 3 have elasticity. Further, the dot spacers 53 work for spatially separating the layers in the standby state.

In contrast, when pressure is applied by pressure applying means 50 from the outside, the upper heat generating layer 51 is deformed downward so that the upper heat generating layer 51 comes into partial contact with the lower heat generating layer 52. As a result, heat is locally generated in the contact portion. This heat is detected by the position detection device described above in the first embodiment, and hence the two-dimensional position where the pressure is applied can be measured and recorded.

As the principle of generating heat when the upper heat generating layer 51 comes into contact with the lower heat generating layer 52, various principles described below can be used.

For example, two materials that cause chemical reaction can be used for the upper heat generating layer 51 and the lower heat generating layer 52. Thus, chemical reaction occurs at a place where the upper heat generating layer 51 and the lower heat generating layer 52 come into contact with each other so that a local reaction heat is generated.

In addition, it is possible to adopt a structure in which the device stands by under a state where an external bias voltage is applied between the upper heat generating layer 51 and the lower heat generating layer 52, and hence a current flows only in the place where the upper heat generating layer 51 and the lower heat generating layer 52 are held in contact with each other. In this case, ohmic heat generation due to an electric resistance in this portion can be used for the position input.

Further, it is possible to generate heat by, as a trigger, a pressure (or distortion) generated when the upper heat generating layer 51 is pressed to the lower heat generating layer 52. For example, by measuring in the same method reaction heat or latent heat generated by chemical reaction or phase change due to the application of the pressure, it is possible to perform position detection.

Other than that, it is also possible to use friction heat generated when the upper heat generating layer 51 and the lower heat generating layer 52 come into contact with each other as described in the example below.

Example 5

Figure 15:
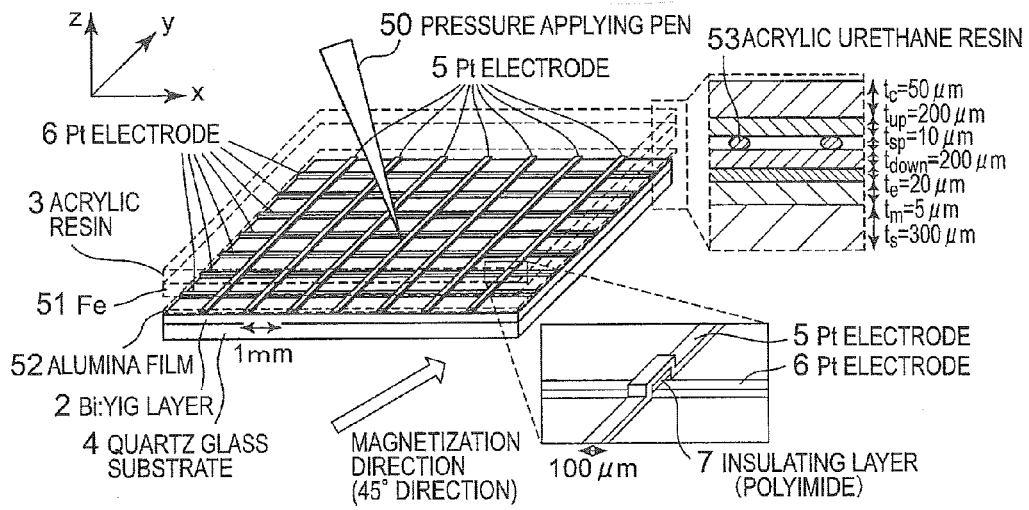
FIG. 15 is a diagram illustrating a position detection device of Example 5 of this invention.

FIG. 15 illustrates a specific example of this invention.

In this example, as the magnetic layer 2, an yttrium iron garnet film is used, in which a part of Y-site is replaced with Bi (hereinafter referred to as Bi:YIG film, in a composition of $BiY_2Fe_5O_{12}$). Pt is used for the X position detecting electrode 5 and the Y position detecting electrode 6. Here, the Bi:YIG film has a thickness of 5 µM, and the Pt electrode has a thickness of 20 nm. In addition, each Pt electrode has a line shape having a line width of 100 µm, and an interval between the electrodes is 1 mm. A quartz glass substrate having a thickness of 300 µm is used as the substrate 4, and an acrylic resin having a thickness of 50 µm is used as the cover layer 3. A polyimide resin is used for the insulating layer 7.

An Fe layer having a thickness of 200 nm is used as the upper heat generating layer 51. An alumina layer having a thickness of 200 nm is used as the lower heat generating layer 52. These layers are disposed so as to be spatially separated by the dot spacers 53 made of an acrylic urethane resin and having a diameter of 10 µm.

Here, when the Fe layer 51 is pressed to the alumina layer 52 by the pressure applying pen 50, friction heat is generated due to the collision at this portion. The thermal electromotive force due to this heat generation is detected by the Pt electrode, and hence the position information can be input.

Sixth and Seventh Embodiments

In the first to fifth embodiments (except for the structure that requires the bias voltage in the fifth embodiment), under standby in an equilibrium state where no external heat or heat gradient exists, the position at which heat is applied from the outside is detected by the thermal electromotive force generated in a matrix electrode constituted of a plurality of electrodes arranged in parallel in the Y and X directions. By using this device, it is possible to use an interface that can be used with zero standby power even in a situation where no external power supply exists. Note that, in a situation where external heat input or heat fluctuation is large, it is difficult to detect extremely small heat by the matrix electrode with a high S/N ratio.

On the other hand, there are various stationary heat sources or stationary temperature gradients such as body temperature, a display, IT equipment, or the like in ambient. By using this bias temperature gradient effectively, it is possible to constitute a useful interface even in a situation where heat flow is constantly generated. In the following embodiments, there is described a position detection device that can be used in a situation where the stationary temperature gradient is generated in advance.

Sixth Embodiment

Stationary Temperature Gradient Expression and Heat Sensor Array

Figure 16:
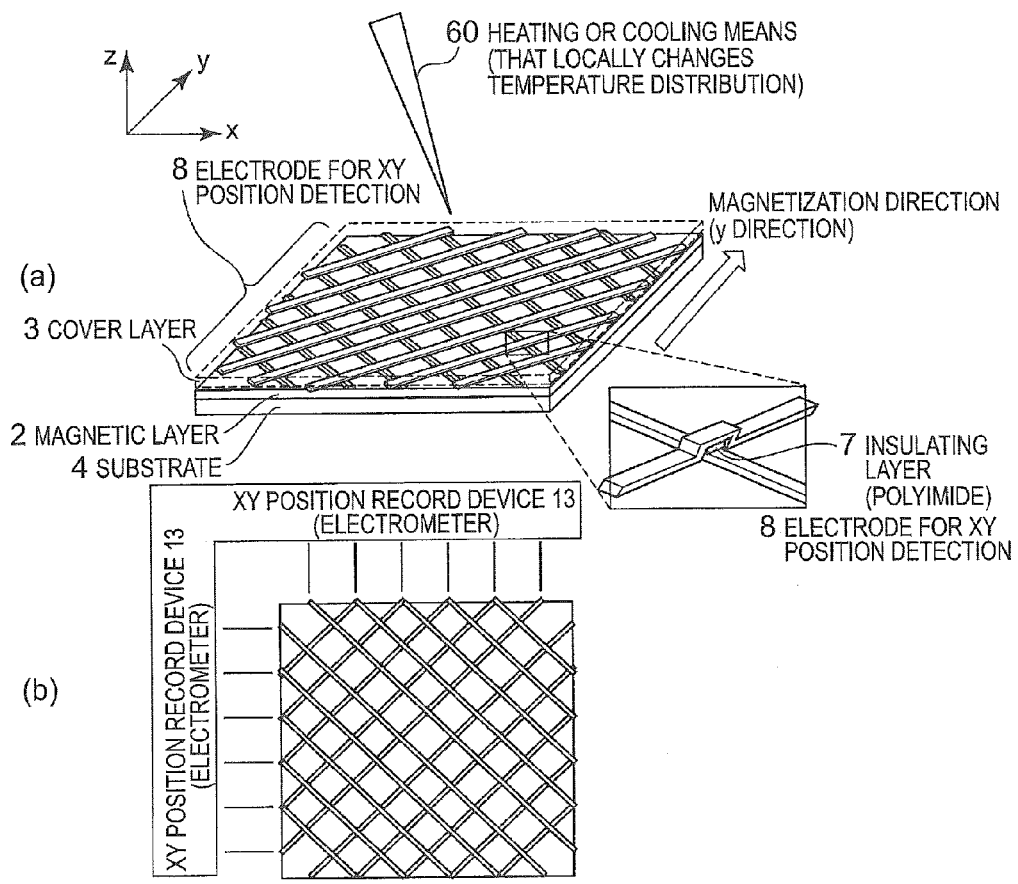
FIG. 16 is comprised of diagrams (a) and (b) illustrating a position detection device according to a sixth embodiment of this invention.

FIG. 16 illustrate perspective views of a position detection device according to a sixth embodiment of this invention.

The position detection device includes the thermoelectric conversion portion including the substrate 4, the magnetic layer 2, a XY position detecting electrode 8 formed by a plurality of electrodes disposed on the magnetic layer 2 in a matrix, the insulating layer 7 for electric insulation at points where the electrode 8 intersect each other, and the cover layer 3 for protecting the entire structure. Here, the XY position detecting electrode 8 for detecting a two-dimensional position has an elongated linear shape extending in the direction at an angle of 45 degrees or 135 degrees in the XY plane illustrated in the figure.

It is assumed that the magnetic layer 2 has magnetization in a direction parallel to the film surface (XY plane in FIG. 16). Similarly to the first embodiment, the magnetization direction has finite angles to the two longitudinal directions of the electrodes 8. In particular, in the structure of FIG. 16, it is desired to have magnetization in the X direction or in the Y direction. In this embodiment, it is assumed that the magnetization is in the Y direction.

As to a material of the magnetic layer 2, because a material having smaller thermal conductivity exerts a thermoelectric effect more efficiently, a magnetic insulator such as garnet ferrite is used in this embodiment. By using a magnetic material having a coercive force as the magnetic layer 2, it is possible to obtain a device capable of operating under zero magnetic field by initializing the magnetization direction once by an external magnetic field or the like.

The XY position detecting electrode 8 contains a material having a spin-orbit interaction for extracting the thermal electromotive force by using the inverse spin Hall effect. For example, a metal material having a relatively large spin-orbit interaction such as Au, Pt, or Pd, or an alloy material thereof is used. Here, in order to convert the spin current into electricity at high efficiency, it is preferred to set the thickness of the electrode to at least a spin diffusion length of the metal material or larger.

Figure 17:
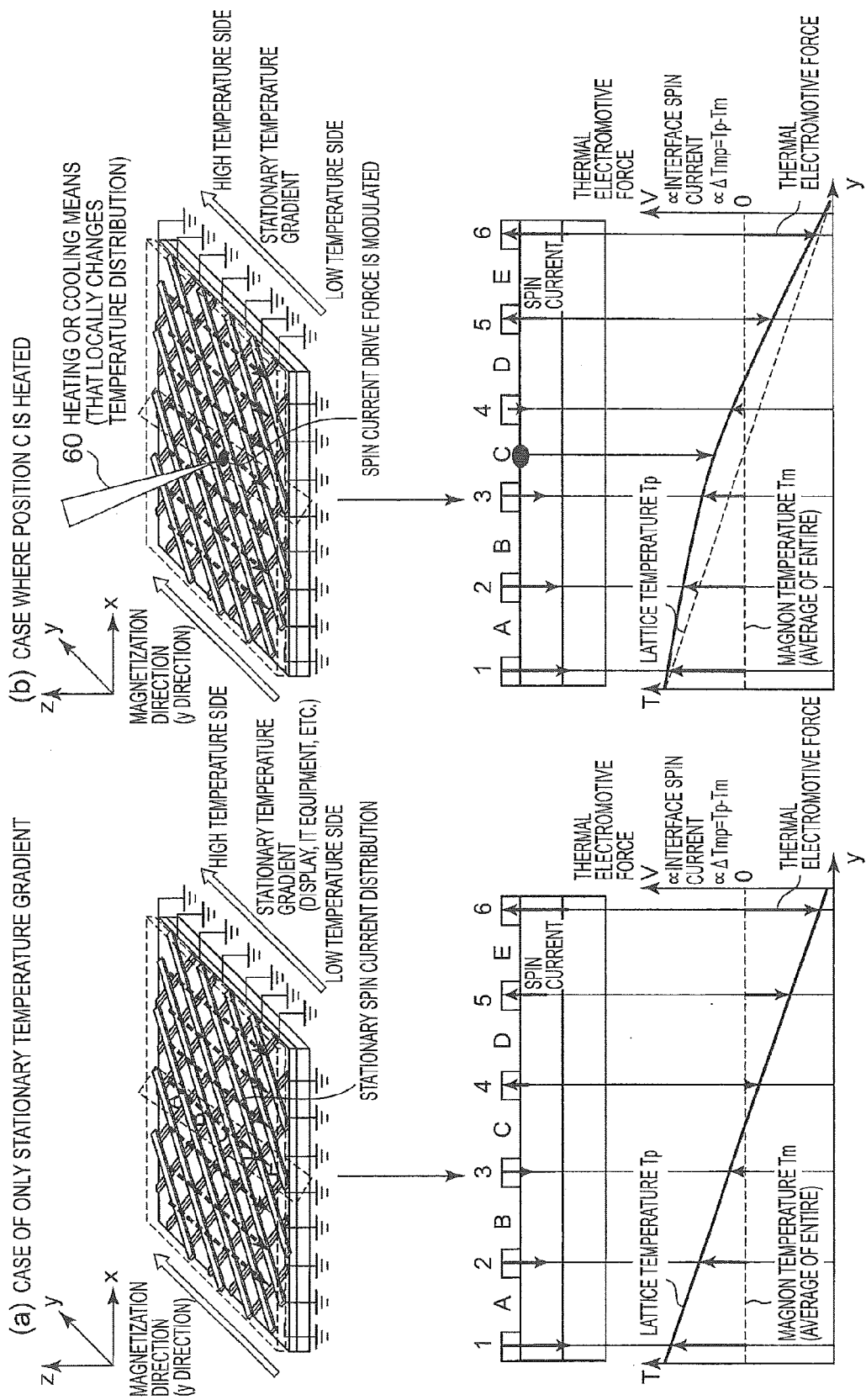
FIG. 17 is comprised of diagrams (a) and (b) illustrating an input operation of the position detection device illustrated in FIG. 16.

Next, an operation method for this position detection device is described. First, a stationary in-plane temperature gradient is applied to this position detection device. It is desired that the temperature gradient direction have finite angles to the two longitudinal directions of the XY position detecting electrode 8. In particular, in the structure illustrated in FIG. 17, it is preferred that the temperature gradient be applied in the X direction or in the Y direction. In this embodiment, a situation is considered where the temperature gradient is generated in the Y direction of the device as illustrated in FIG. 17(a). In other words, it is assumed that the +y side of the device is the high temperature side while the −y side of the device is the low temperature side.

As a heat source for generating the stationary temperature gradient, various heat sources such as a chimney effect on the display (a phenomenon in which an upper part of the screen is warmed), a side face of IT equipment, and a wall or a window of a building hit by sunlight can be used. In addition, even if the heat source itself does not have a spatial temperature gradient, a similar in-plane temperature gradient can be generated in the position detection device by causing one end of the position detection device to be close to a warm (or cool) heat source while causing the other end to be close to a hot bath system, for example.

In this situation, as illustrated by a dotted line in the upper part of FIG. 17(a), a stationary spin current is driven from the high temperature side to the low temperature side of the magnetic layer 2. This spin current flows into the XY position detecting electrode 8 so that the thermal electromotive force is generated.

This spin Seebeck phenomenon is microscopically driven by a difference ΔTmp between the lattice temperature Tp and the magnon temperature Tm as described above. An amplitude of the thermal electromotive force generated in the XY position detecting electrode 8 can be considered to be proportional to the temperature difference ΔTmp when the parameter of the width, the length or the like is constant. Therefore, under the stationary temperature gradient as illustrated in FIG. 17(a), a stationary temperature difference depending on the space is generated between the lattice temperature and the magnon temperature. Therefore, a stationary thermal electromotive force proportional to the stationary temperature difference is generated also in the XY position detecting electrode 8.

In FIG. 17(*a*), particularly concerning the part of the device surrounded by a dotted line, distributions of the lattice temperature Tp and the magnon temperature Tm in the magnetic layer 2 are shown in which the horizontal axis represents the x position. Here, a boundary condition is assumed, in which the thermal conductivity is uniform in the magnetic layer 2, and a constant heat flow escapes from the end portion. As illustrated in the figure, it is assumed that the lattice temperature Tp has a distribution of changing linearly to the temperature gradient, while the magnon temperature Tm has a uniform value as an average value of the entire magnetic material. Therefore,
a temperature difference depending on the position is generated between the lattice temperature and the magnon temperature.

Therefore, in the electrode just above this magnetic layer, there is generated a stationary thermal electromotive force proportional to this temperature difference. Further, FIG. 17(*a*) specifically illustrates only the part surrounded by the dotted line, but an actual electromotive force generated between the ends of the XY position detecting electrode 8 is a signal in which the spin Seebeck effect is accumulated over the entire magnetic layer.

Here, as illustrated in FIG. 17(*b*) for example, when a point C of the magnetic layer 2 is heated or cooled by external heating or cooling means 60, a temperature distribution changes, and hence a thermal electromotive force generation distribution due to the spin Seebeck effect is modulated. The thermal electromotive force distribution change is greatly different depending on the point where the heating or cooling is generated. Therefore, it is possible to determine the two-dimensional position where the heating or cooling is generated, by measuring and recording this electromotive force distribution by an XY position record device 13, and then analyzing and estimating the temperature distribution.

Note that, similarly to the first embodiment, it is also possible to perform fine (high resolution) position determination by quantitatively comparing amplitudes of electromotive forces of the plurality of electrodes.

Example 6

FIG. 18 illustrates a specific example of this invention.

In this example, as the magnetic layer 2, an yttrium iron garnet film is used, in which a part of Y-site is replaced with Bi (hereinafter referred to as Bi:YIG film, in a composition of $BiY_2Fe_5O_{12}$). Pt is used for the XY position detecting electrode 8. Here, the Bi:YIG film has a thickness of 5 μm, and the Pt electrode has a thickness of 20 nm. In addition, each Pt electrode has a line shape having a line width of 100 μm, and an interval between the electrodes is 1 mm.

As the heating or cooling means 60, a pen having the tip heated at 40° C. is used here. As the substrate 4, a quartz glass substrate having a thickness of 300 μm is used. As the cover layer 3, an acrylic resin having a thickness of 50 μm is used. A polyimide resin is used for the insulating layer 7. A high temperature side of the device is set to 30° C., while a low temperature side of the device is set to 20° C., and hence a temperature gradient is generated inside the device.

The magnetic layer 2 made of Bi:YIG is faulted by an aerosol deposition method. As a raw material of Bi:YIG, fine grains of Bi:YIG having a diameter of 300 nm are used. The fine grains of Bi:YIG are filled in an aerosol generating container, and the glass substrate 4 is fixed to a holder in a film forming chamber. In this state, a pressure difference is generated between the film forming chamber and the aerosol generating container, so that the fine grains of Bi:YIG are sucked into the film foaming chamber and are sprayed onto the substrate through a nozzle. In this case, collision energy on the substrate causes the fine grains to be milled and recombined so that Bi:YIG polycrystalline is formed on the glass substrate 4. By scanning the substrate stage in a two-dimensional manner, a uniform Bi:YIG magnetic layer 2 having a thickness of 5 μm is formed on the substrate.

After that, the surface of the magnetic layer 2 is polished if necessary, and then the Pt electrode 8, and the insulating layer 7 are all formed by the ink jet method. Specifically, ink containing Pt is applied in a line shape extending from the right front side to the left back side of the figure so as to produce a part of the Pt electrode 8. Then, the polyimide insulating layer 7 is deposited by the ink jet at the position where a part of the Pt electrode 8 intersects the remaining part of the Pt electrode 8. After that, the remaining part of the Pt electrode 8 extending from the left front side to the right back side of the figure is formed by the ink jet.

Finally, organic solution in which an acrylic material is dissolved is applied onto the Pt electrode and is dried at high temperature of approximately 100° C. so that the cover layer 3 having a thickness of 50 μm is formed.

Seventh Embodiment

Stationary Temperature Gradient Expression and Pressure Sensor Array

Figure 19:
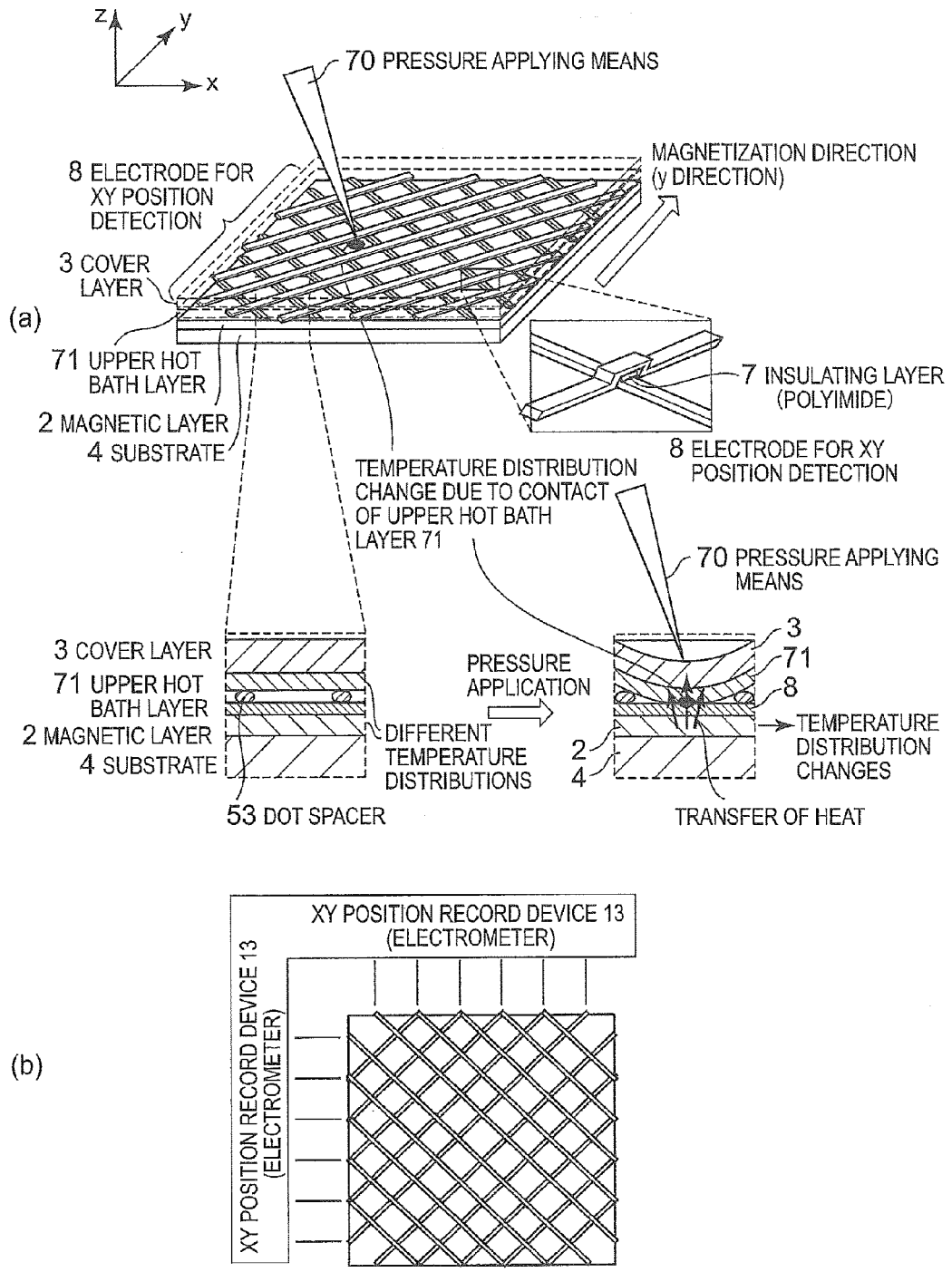
FIG. 19 is comprised of diagrams (a) and (b) illustrating a position detection device according to a seventh embodiment of this invention.

In a seventh embodiment illustrated in FIG. 19, the position input can be performed by using an external pressure. Here, a pressure detection portion including an upper hot bath layer 71 is disposed above the electrode/magnetic layer via the dot spacers 53. In the standby state, the electrode/magnetic layer and the upper hot bath layer are spatially separated by the dot spacers 53.

Here, a material having small thermal conductivity such as an organic resin is used for the dot spacer 53. Thus, between the electrode/magnetic layer and the upper hot bath layer, thermal movement is small in the standby state, and the electrode/magnetic layer and the upper hot bath layer can take different temperature distributions.

Figure 20:
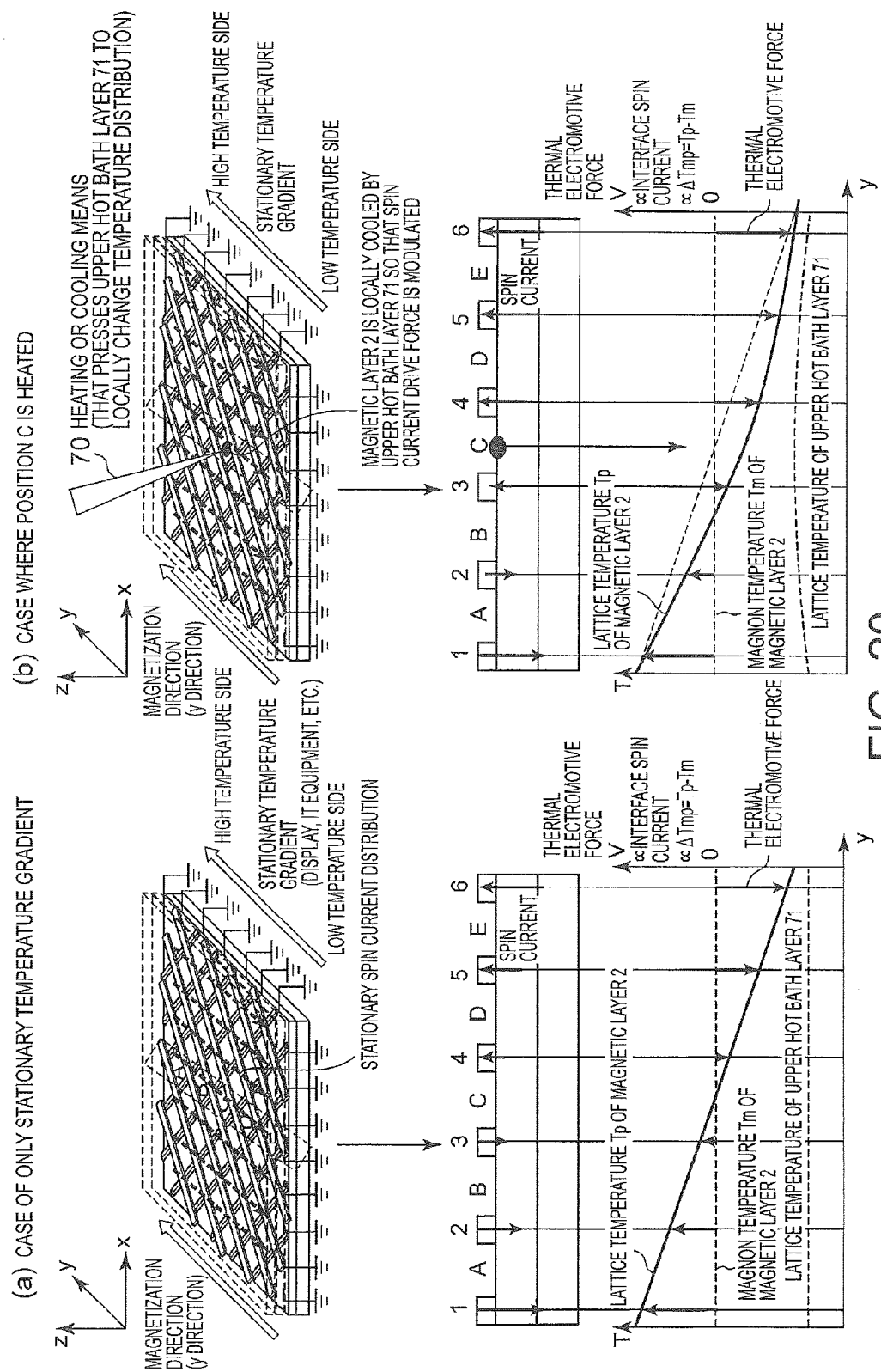
FIG. 20 is comprised of diagrams (a) and (b) illustrating an input operation of the position detection device illustrated in FIG. 19.

Here, as specifically illustrated in FIG. 20(*a*), a situation is considered where the electrode/magnetic layer is attached to a high temperature heat source having an in-plane temperature gradient (in the y direction). In addition, the dot spacers 53 are interposed between the upper hot bath layer 71 and the electrode/magnetic layer, and the upper hot bath layer 71 is separated from the heat source, and hence the upper hot bath layer 71 has a lower temperature.

In this situation, when a pressure is externally applied to a point by pressure applying means 70 as illustrated in FIG. 20(*b*), the upper hot bath layer 71 as the hot bath comes into contact with the electrode/magnetic layer at the point so as to cause a thermal movement. In other words, the upper hot bath layer 71 locally cools the electrode/magnetic layer (performs negative heating). A temperature distribution change due to the local cooling can be detected from a change of the thermal electromotive force of the electrode 8 in the same method as in the sixth embodiment.

Similarly to the sixth embodiment, the above-mentioned thermal electromotive force distribution change is greatly different depending on the point to which the pressure is applied by the pressure applying means 70. Therefore, it is possible to determine the two-dimensional position to which the pressure is applied, by measuring and recording this electromotive force distribution by the XY position record device 13, and then analyzing and estimating the temperature distribution.

Note that, a situation is assumed in FIG. 20 where there is a temperature gradient also in the in-plane (in the y direction). However, this position detection device can operate if there is a temperature distribution difference between the electrode/magnetic layer and the upper hot bath layer 71 in the standby state. Therefore, the use scene of the temperature gradient is not limited to this embodiment. For example, it is possible to use a temperature gradient in the direction orthogonal to the plane (in the z direction) for operation. In addition, the same operation can be performed in a situation where temperature of the upper hot bath layer 71 is higher than that of the electrode/magnetic layer.

Example 7

Figure 21:
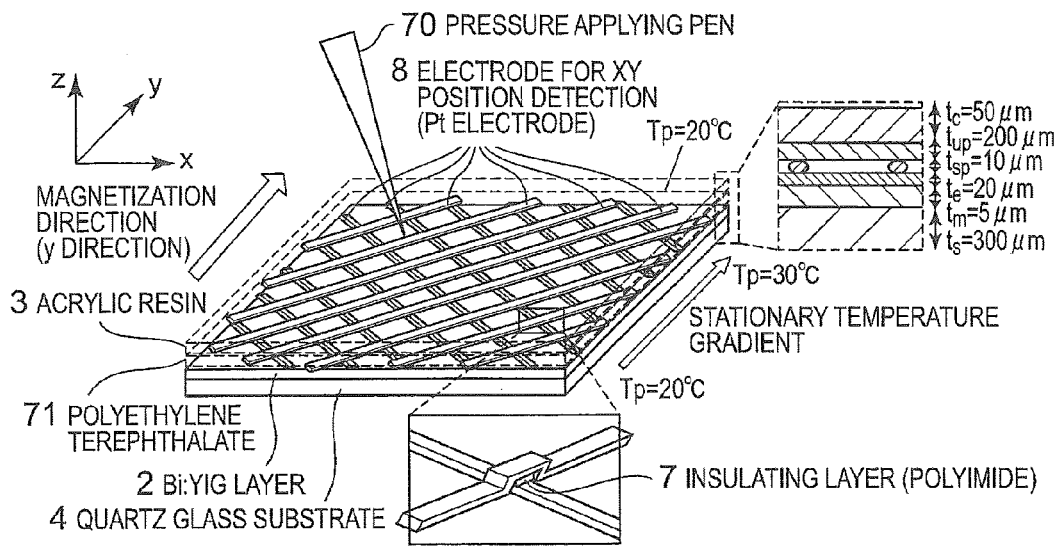
FIG. 21 is a diagram illustrating a position detection device of an embodiment of Example 7 of this invention.

FIG. 21 illustrates a specific example of this invention.

In this example, as the magnetic layer 2, an yttrium iron garnet film is used, in which a part of Y-site is replaced with Bi (hereinafter referred to as Bi:YIG film, in a composition of $BiY_2Fe_5O_{12}$). Pt is used for the XY position detecting electrode 8. Here, the Bi:YIG film has a thickness of 5 µm, and the Pt electrode has a thickness of 20 nm. Each Pt electrode has a line shape having a line width of 100 µm, and an interval between the electrodes is 1 mm. A quartz glass substrate having a thickness of 300 µm is used as the substrate 4, and an acrylic resin having a thickness of 50 µm is used as the cover layer 3. A polyimide resin is used for the insulating layer 7.

Polyethylene terephthalate having a thickness of 200 nm is used for the upper hot bath layer 71. This layer is disposed to be spatially separated from the Pt/Bi:YIG layer by the dot spacers 53 made of an acrylic urethane resin and having a diameter of 10 µm.

In the standby state, temperature on the high temperature side (+y side) of the Pt/Bi:YIG layer is set to 30° C., while on the low temperature side (−y side) of the Pt/Bi:YIG layer is set to 20° C. by an external heat source. The upper hot bath layer is thermally insulated by the dot spacers and has a temperature of 20° C. in its entirety.

In this state, when the upper hot bath layer 71 is pressed to the Pt/Bi:YIG layer by the pressure applying pen 70, the temperature distribution of the Pt/Bi:YIG layer is changed around this part. In other words, heat flows from the Pt/Bi:YIG layer to the upper hot bath layer through the contact portion and the Pt/Bi:YIG layer is locally cooled. The thermal electromotive force change due to the temperature distribution change is detected by the Pt electrode, and hence input of position information can be performed.

Eighth Embodiment

Magnon Temperature Modulation Type, Local Magnetic Field Sensor Array, and the Like In the first to seventh embodiments, the position detection method utilizing external heating of the magnetic layer, namely a lattice temperature modulation is described. However, in a situation where the stationary temperature gradient can be used as in the sixth and seventh embodiments, the position detection application can be realized by modulating the magnon temperature Tm (effective temperature parameter indicating intensity of the magnon thermal motion) with other various flexibility, instead of changing the lattice temperature Tp (temperature in the normal meaning) by external heating.

As described above, in a situation where the interaction between the magnon and the environment is small, the magnon can move in the magnetic material in the thermal non-equilibrium state with the phonon system. Therefore, it is assumed that the magnon temperature has a constant value as an average value of the temperature distribution in the entire magnetic material by simple approximation. However, by using modulation means for externally promoting the magnon scattering in a local manner, the magnon temperature Tm can be changed. Further, also by this method, the thermal electromotive force of the spin Seebeck effect can be modulated.

Figure 22:
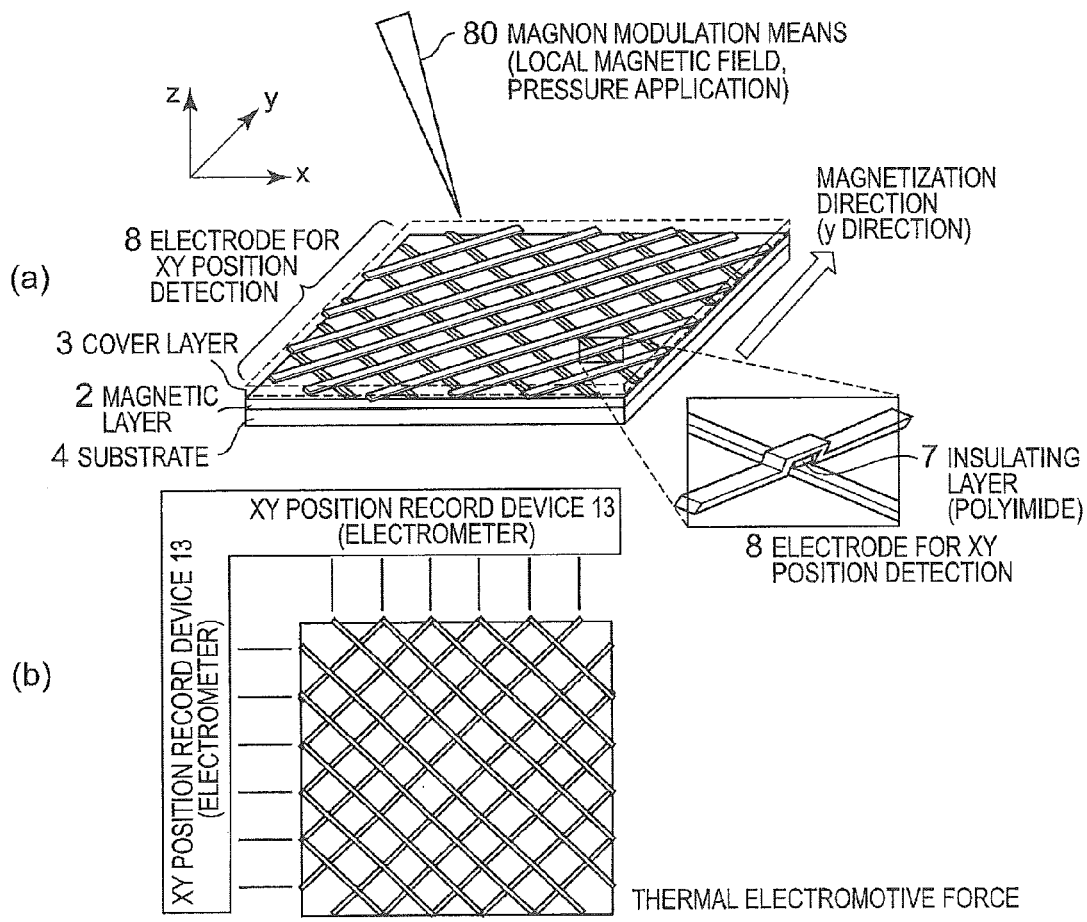
FIG. 22 is comprised of diagrams (a) and (b) illustrating a position detection device according to an eighth embodiment of this invention.

FIG. 22 illustrate a position detection device according to an embodiment which employs the above-mentioned method. The basic device structure is substantially the same as that of the sixth embodiment illustrated in FIG. 16, and the stationary spin current under a state where there is the in-plane temperature gradient is used. Only one structural difference from the sixth embodiment is that magnon modulation means 80 is used instead of the heating or cooling means 50.

Figure 23:
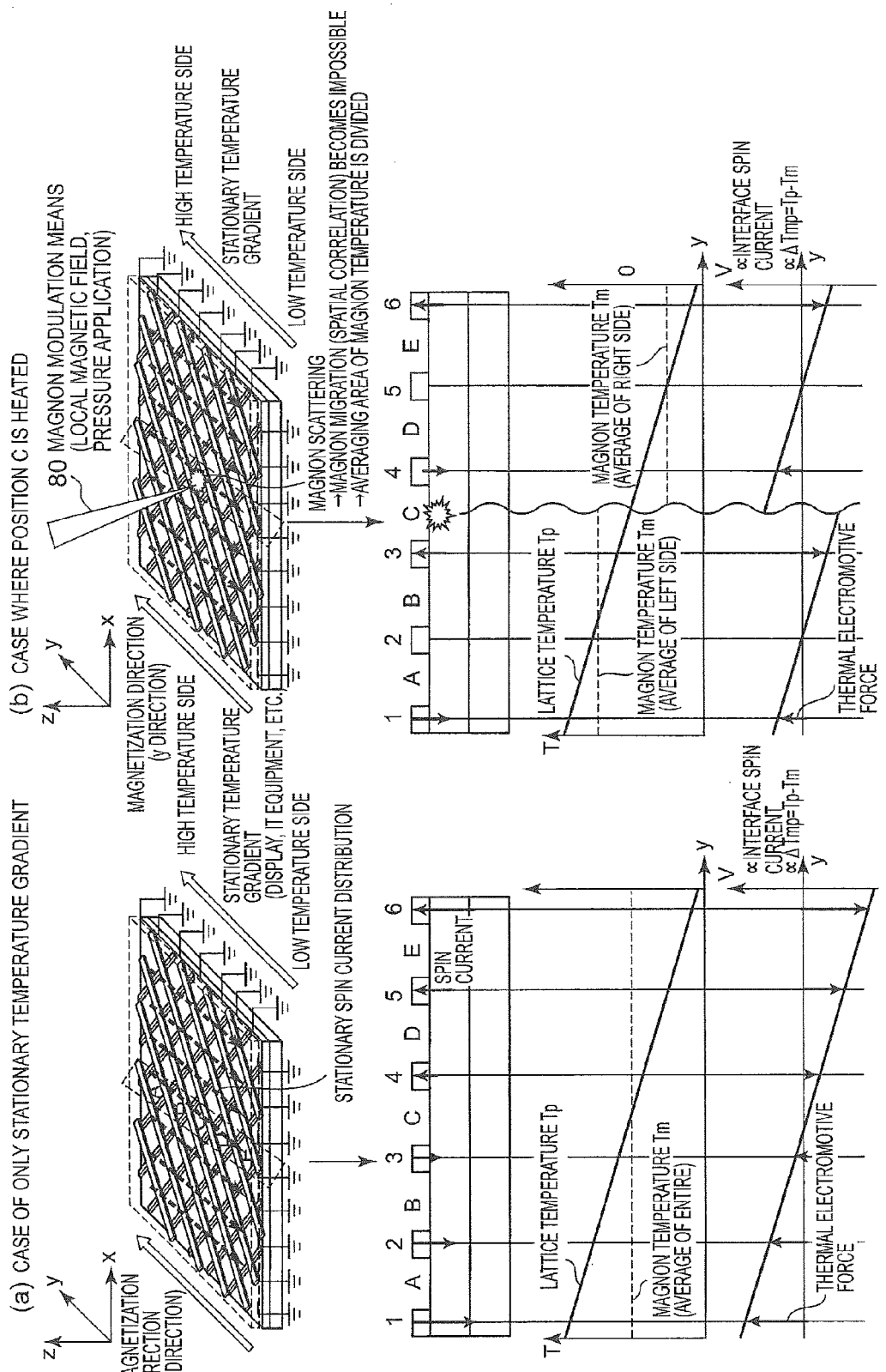
FIG. 23 is comprised of diagrams (a) and (b) illustrating an input operation of the position detection device illustrated in FIG. 22.

FIGS. 23(*a*) and 23(*b*) illustrate distributions of the lattice temperature Tp and the magnon temperature Tm in the magnetic material portion surrounded by the dotted line (middle part) and the generation distribution of a thermal electromotive force V in an electrode close thereto (lower part) (a) before the modulation by the modulation means 60 and (b) in the modulation. By causing the magnon modulation means 80 to be close to the magnetic layer 2, magnon scattering probability in the magnetic layer 2 is locally increased, and hence the magnon temperature is changed.

Specifically, as illustrated in the middle parts of FIGS. 23(*a*) and 23(*b*), particularly concerning the part of the device surrounded by the dotted line, distributions of the lattice temperature Tp and the magnon temperature Tm in the magnetic layer 2 are illustrated, in which the horizontal axis represents the x position. Here, a boundary condition is assumed, in which the thermal conductivity is uniform in the magnetic layer 2, and a constant heat flow escapes from the end portion.

As illustrated in this figure, in both of cases (a) and (b), the lattice temperature Tp changes linearly in accordance with the temperature gradient.

On the other hand, the magnon temperature Tm is greatly affected by the presence or absence of the magnon modulation means 80. In other words, (a) Tm before the modulation has the uniform value as the average of the entire magnetic material, while (b) in the point C modulation, magnon scattering is enhanced at the point. Therefore, spatial correlation of the magnon temperature Tm is weakened from the point as a boundary, and the magnon temperature distribution is changed over the entire surface of the magnetic material. As a result, a large change is generated also in the thermal electromotive force distribution in the electrode illustrated in the lower part of the figure depending on the presence or absence of the magnon modulation means 80.

In FIG. 23(*b*), the magnon modulation performed at the point C is assumed. However, if another point is modulated, a magnon temperature distribution different from FIG. 23(*b*) is generated, and a different thermal electromotive force distribution is generated in the XY position detecting electrode 8. (Note that, only the part surrounded by the dotted line is cut out to be shown in FIG. 23(*b*), but the actual thermal electromotive force generated between the ends of the XY position detecting electrode 8 becomes a signal in which the spin Seebeck effect is accumulated over the entire magnetic layer.) In this way, because different thermal electromotive force distributions are generated depending on the point where the modulation occurs. Therefore, similarly to the embodiments described above, this electromotive force distribution is measured and recorded by the XY position record device 13, and then the temperature distribution is analyzed and estimated. Thus, the two-dimensional position where the modulation occurs can be deter mined.

Note that, as the magnon modulation means 80, it is possible to use a local electric or magnetic field, a local pressure, or an electromagnetic wave. Thus, an effective potential sensed by the magnon is effectively modulated. As a result, scattering frequency at the point is increased.

Example 8

Figure 24:
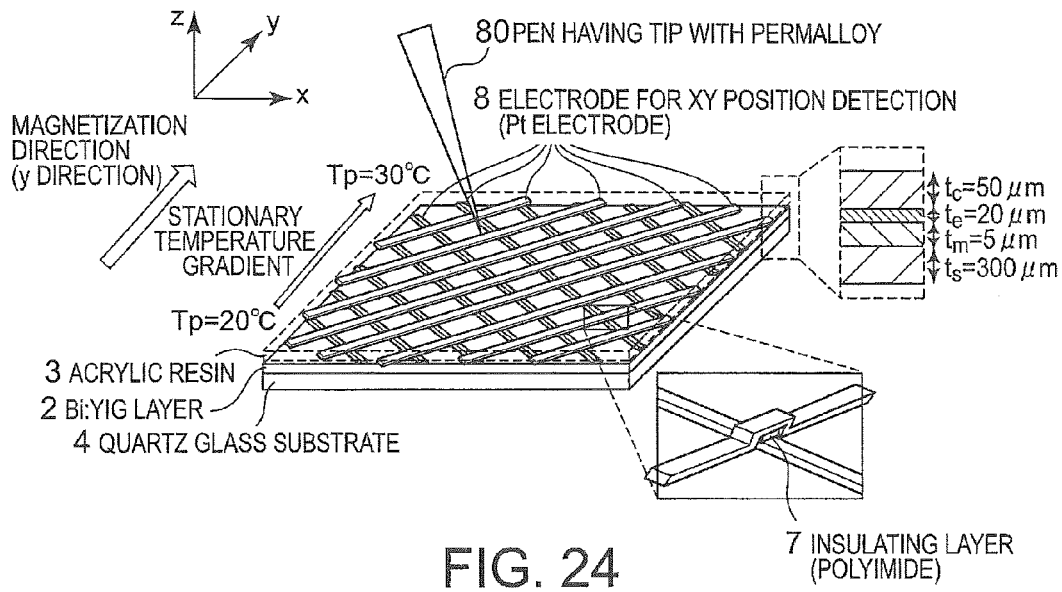
FIG. 24 is a diagram illustrating a position detection device of an embodiment of Example 8 of this invention.

FIG. 24 illustrates a specific example of this invention using the magnon modulation by the local magnetic field.

In this example, as the magnetic layer 2, an yttrium iron garnet film is used, in which a part of Y-site is replaced with Bi (hereinafter referred to as Bi:YIG film, in a composition of $BiY_2Fe_5O_{12}$). Pt is used for the XY position detecting electrode 8. Here, the Bi:YIG film has a thickness of 5 μm, and the Pt electrode has a thickness of 20 nm. In addition, each Pt electrode has a line shape having a line width of 100 μm, and an interval between the electrodes is 1 mm.

A pen having the tip to which permalloy is adhered is used as the magnon modulation means 80. A quartz glass substrate having a thickness of 300 μm is used as the substrate 4. An acrylic resin having a thickness of 50 μm is used as the cover layer 3. A polyimide resin is used as the insulating layer 7. The high temperature side of the device is set to 30° C., the low temperature side of the device is set to 20° C., and a temperature gradient is generated in the device.

INDUSTRIAL APPLICABILITY

While this invention has been described with reference to the plurality of embodiments and examples, this invention is not limited to the above-mentioned embodiments and examples. Various changes that can be understood by a person skilled in the art can be made to the configuration and details of this invention without departing from the spirit of the invention described in claims.

Further, part or whole of the above-mentioned examples can also be described as in the following notes, but this invention is not limited thereto.

(Note 1) A position detection device, including a thermoelectric conversion portion including a magnetic layer having magnetization and a plurality of electrodes which are made of a material having spin-orbit interaction and are formed on the magnetic layer so as to extend in a direction intersecting a magnetization direction of the magnetic layer, in which the thermoelectric conversion portion modulates an effective temperature in the magnetic layer so as to induce a spin Seebeck effect when an arbitrary location on a layer-surface of the magnetic layer is heated, and generates a voltage corresponding to a heated position from the plurality of electrodes as position information.

(Note 2) A position detection device according to Note 1, further including heating means provided separately from the thermoelectric conversion portion, for heating the arbitrary location on the layer-surface of the magnetic layer.

(Note 3) A position detection device according to Note 1 or 2, in which the plurality of electrodes are disposed in parallel to one another.

(Note 4) A position detection device according to Note 1 or 2, in which the plurality of electrodes are disposed in a matrix, including a first electrode group and a second electrode group that are perpendicular to each other.

(Note 5) A position detection device according to any one of Notes 1 to 4, in which each of the plurality of electrodes has an angle of 45 degrees to the magnetization direction of the magnetic layer.

(Note 6) A position detection device according to any one of Notes 1 to 5, further including an electromagnetic wave detection portion which is formed on the thermoelectric conversion portion correspondingly to the magnetic layer, and includes an electromagnetic wave absorption layer for absorbing an electromagnetic wave so as to generate heat, in which the electromagnetic wave detection portion generates heat based on an electromagnetic wave applied to a location corresponding to the arbitrary location on the layer-surface of the magnetic layer, to thereby heat the arbitrary location on the layer-surface of the magnetic layer.

(Note 7) A position detection device according to any one of Notes 1 to 5, further including a friction detection portion which is formed on the thermoelectric conversion portion correspondingly to the magnetic layer, and includes a friction heat generating layer for generating heat by friction, in which the friction detection portion generates heat based on a friction applied to a location corresponding to the arbitrary location on the layer-surface of the magnetic layer, to thereby heat the arbitrary location on the layer-surface of the magnetic layer.

(Note 8) A position detection device according to any one of Notes 1 to 5, further including a floating substance detection portion which is formed on the thermoelectric conversion portion correspondingly to the magnetic layer, and includes a floating substance detection layer for generating heat by a chemical reaction when a specific floating substance is adhered, in which the floating substance detection portion generates heat based on the chemical reaction due to the floating substance adhered to an arbitrary surface position, to thereby heat the arbitrary location on the layer-surface of the magnetic layer.

(Note 9) A position detection device according to any one of Notes 1 to 5, further including a pressure detection portion which is formed on the thermoelectric conversion portion correspondingly to the magnetic layer, and includes a heat generating layer for generating heat by receiving a pressure, in which the pressure detection portion generates heat based on a pressure applied to a location corresponding to the arbitrary location on the layer-surface of the magnetic layer, to thereby heat the arbitrary location on the layer-surface of the magnetic layer.

(Note 10) A position detection device according to Note 9, in which the heat generating layer includes a lower heat generating layer which is formed on the thermoelectric conversion portion correspondingly to the magnetic layer, and an upper heat generating layer which has elasticity and is laminated on the lower heat generating layer via a spacer, and when the upper heat generating layer receives a pressure so as to come into contact with the lower heat generating layer, at least the lower heat generating layer out of the lower heat generating layer and the upper heat generating layer is heated.

(Note 11) A position detection device according to any one of Notes 1 to 10, in which a stationary temperature gradient is applied to the magnetic layer.

(Note 12) A position detection device according to Note 11, to be mounted in electronic equipment, in which an upper end side of a stationary temperature gradient of the magnetic layer contacts with a heat generating member of the electronic equipment, while a lower end side contacts with a hot bath member of the electronic equipment.

(Note 13) A position detection device according to any one of Notes 1 to 12, in which a lattice temperature or a magnon temperature is modulated as the effective temperature in the magnetic layer.

This application claims priority from Japanese Patent Application No. 2011-104544, filed on May 9, 2011, the entire disclosure of which is incorporated herein.

The invention claimed is:

1. A position detection device, comprising:
  a thermoelectric conversion portion including:
    a magnetic layer having magnetization; and
    a plurality of electrodes which comprise a material having spin-orbit interaction and are formed on the magnetic layer so as to extend in a direction intersecting a magnetization direction of the magnetic layer,
  wherein the thermoelectric conversion portion modulates an effective temperature in the magnetic layer so as to induce a spin Seebeck effect when an arbitrary location on a layer-surface of the magnetic layer is heated, and generates a voltage corresponding to a heated position from the plurality of electrodes as position information,
  wherein the plurality of electrodes are disposed in a matrix, including a first electrode group and a second electrode group that are perpendicular to each other,
  wherein the first electrode group and the second electrode group include electrodes disposed in parallel to one another, respectively,
  wherein the electrodes of the first electrode group have an angle of 45 degrees to the magnetization direction of the magnetic layer, and
  wherein the electrodes of the second electrode group have an angle of 45 degrees to the magnetization direction of the magnetic layer, and
  wherein a thickness of the plurality of electrodes disposed in the matrix are equal to a spin diffusion length of the electrode material.

2. The position detection device according to claim 1, further comprising heating means provided separately from the thermoelectric conversion portion, for heating the arbitrary location on the layer-surface of the magnetic layer, the heating means being a heated object, heat from vibration, electromagnetic waves, chemical reactions, or phase changes.

3. The position detection device according to claim 1, further comprising an electromagnetic wave detection portion which is formed on the thermoelectric conversion portion correspondingly to the magnetic layer, and includes an electromagnetic wave absorption layer absorbing an electromagnetic wave so as to generate heat,
  wherein the electromagnetic wave detection portion generates heat based on an electromagnetic wave applied to a location corresponding to the arbitrary location on the layer-surface of the magnetic layer, to thereby heat the arbitrary location on the layer-surface of the magnetic layer.

4. The position detection device according to claim 1, further comprising a friction detection portion which is formed on the thermoelectric conversion portion correspondingly to the magnetic layer, and includes a friction heat generating layer generating heat by friction,
  wherein the friction detection portion generates heat based on a friction applied to a location corresponding to the arbitrary location on the layer-surface of the magnetic layer, to thereby heat the arbitrary location on the layer-surface of the magnetic layer.

5. The position detection device according to claim 1, further comprising a floating substance detection portion which is formed on the thermoelectric conversion portion correspondingly to the magnetic layer, and includes a floating substance detection layer generating heat by a chemical reaction when a specific floating substance is adhered,
  wherein the floating substance detection portion generates heat based on the chemical reaction due to the floating substance adhered to an arbitrary surface position, to thereby heat the arbitrary location on the layer-surface of the magnetic layer.

6. The position detection device according to claim 1, wherein a stationary temperature gradient is applied to the magnetic layer.

7. The position detection device according to claim 1, wherein the thermoelectric conversion portion modulates a lattice temperature or a magnon temperature as the effective temperature in the magnetic layer.

8. The position detection device according to claim 1, wherein the plurality of electrodes are disposed at first and second ends of the magnetic layer.

9. The position detection device according to claim 1, further comprising an insulating layer for electric insulation between the plurality of electrodes.

10. The position detection device according to claim 1, further comprising a cover layer for protecting the position detection device.

11. The position detection device according to claim 1, further comprising:
  a cover layer for protecting the position detection device; and
  a wavelength filter disposed above the cover layer so as to detect a specific wavelength.

12. The position detection device according to claim 1, further comprising a floating substance detection portion that includes a floating substance detection film for adsorbing a floating substance, and is disposed on the magnetic layer via a spacer layer.

13. The position detection device according to claim 1, wherein the position detection device is unconnected to an external power supply.

* * * * *